(12) United States Patent
Wu et al.

(10) Patent No.: US 9,871,539 B2
(45) Date of Patent: *Jan. 16, 2018

(54) DRIVER CIRCUIT FOR SIGNAL TRANSMISSION AND CONTROL METHOD OF DRIVER CIRCUIT

(71) Applicant: MEDIATEK INC., Hsin-Chu (TW)

(72) Inventors: Chien-Hua Wu, Taipei (TW); Yan-Bin Luo, Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/069,880

(22) Filed: Mar. 14, 2016

(65) Prior Publication Data

US 2016/0197598 A1  Jul. 7, 2016

Related U.S. Application Data

(63) Continuation-in-part of application No. 14/280,701, filed on May 19, 2014, now Pat. No. 9,312,846.

(Continued)

(51) Int. Cl.
*H03B 1/04* (2006.01)
*H04L 25/00* (2006.01)
(Continued)

(52) U.S. Cl.
CPC ........ *H04B 1/04* (2013.01); *H03K 19/017545* (2013.01); *H03K 19/018578* (2013.01);
(Continued)

(58) Field of Classification Search
CPC ............ H04B 1/04; H03K 19/017545; H03K 19/018578; H03K 19/018585; H04L 25/00; H04L 25/0272
(Continued)

(56) References Cited

U.S. PATENT DOCUMENTS 6,025,742 A  2/2000  Chan
6,686,772 B2  2/2004  Li
(Continued)

FOREIGN PATENT DOCUMENTS

CN  1697339 A  11/2005
GB  2497145 A  6/2013

OTHER PUBLICATIONS

Yan-Bin Luo et al., Title of Invention: Driver Circuit for Signal Transmission and Control Method of Driver Circuit, U.S. Appl. No. 14/822,913, filed Aug. 11, 2015.
(Continued)

*Primary Examiner* — Brandon S Cole
(74) *Attorney, Agent, or Firm* — Winston Hsu

(57) ABSTRACT

A driver circuit for receiving a data input and generating an output signal to a termination element according to at least the first data input is provided. The driver circuit includes a first output terminal, a current mode drive unit and a voltage mode drive unit. The current mode drive unit is arranged for selectively outputting a first reference current from the first output terminal to the termination element according to the first data input, and selectively receiving the first reference current through the first output terminal according to the first data input. The voltage mode drive unit is arranged for coupling one of a first reference voltage and a second reference voltage different from the second reference voltage to the first output terminal according to the first data input.

29 Claims, 22 Drawing Sheets

Related U.S. Application Data

(60) Provisional application No. 61/846,638, filed on Jul. 16, 2013, provisional application No. 62/260,723, filed on Nov. 30, 2015.

(51) Int. Cl.
   *H04B 1/04*     (2006.01)
   *H03K 19/0185*  (2006.01)
   *H04L 25/02*    (2006.01)
   *H03K 19/0175*  (2006.01)

(52) U.S. Cl.
   CPC ..... *H03K 19/018585* (2013.01); *H04L 25/00* (2013.01); *H04L 25/0272* (2013.01)

(58) Field of Classification Search
   USPC ..... 327/108–112, 379, 389, 391; 326/22–27, 326/81–87
   See application file for complete search history.

(56) References Cited

U.S. PATENT DOCUMENTS

| | | | |
|---|---|---|---|
| 6,812,733 B1 | 11/2004 | Plasterer | |
| 7,012,450 B1 | 3/2006 | Oner | |
| 7,298,173 B1 * | 11/2007 | Jiang | H03K 5/06 326/82 |
| 7,514,968 B1 | 4/2009 | Lai | |
| 7,719,314 B1 | 5/2010 | Jiang | |
| 7,848,038 B1 | 12/2010 | Tan | |
| 7,990,178 B2 | 8/2011 | Liu | |
| 8,115,515 B2 | 2/2012 | Roper | |
| 8,446,172 B2 | 5/2013 | Chan | |
| 8,487,654 B1 | 7/2013 | Chen | |
| 9,312,846 B2 | 4/2016 | Wu | |
| 2004/0246613 A1 * | 12/2004 | Tseng | H03K 7/02 360/1 |
| 2006/0208774 A1 * | 9/2006 | Leonowich | H03K 17/6872 327/112 |
| 2006/0290439 A1 | 12/2006 | Martin | |
| 2007/0002954 A1 | 1/2007 | Cornelius | |
| 2008/0034378 A1 | 2/2008 | Kumar | |
| 2009/0203333 A1 | 8/2009 | Jeffries | |
| 2012/0299618 A1 | 11/2012 | Sayuk | |
| 2013/0076404 A1 | 3/2013 | Lee | |
| 2013/0257488 A1 | 10/2013 | Sayuk | |
| 2015/0022243 A1 | 1/2015 | Wu | |

OTHER PUBLICATIONS

Yan-Bin Luo et al., Title of Invention: Driver Circuit with Feed-Forward Equalizer, U.S. Appl. No. 14/825,149, filed Aug. 12, 2015.

\* cited by examiner

DRIVER CIRCUIT FOR SIGNAL TRANSMISSION AND CONTROL METHOD OF DRIVER CIRCUIT

CROSS REFERENCE TO RELATED APPLICATION

This application claims the benefit of U.S. Provisional application No. 62/260,723, filed on Nov. 30, 2015, the contents of which are incorporated herein by reference. This application is also a continuation-in-part of U.S. application Ser. No. 14/280,701 (filed on May 19, 2014), which claims the benefit of U.S. Provisional application No. 61/846,638 (filed on Jul. 16, 2013). The entire contents of the related applications are included herein by reference.

BACKGROUND

The disclosed embodiments of the present invention relate to signal driving scheme, and more particularly, to a driver circuit used for signal transmission and a related control method.

Traditional serializer/deserializer (SerDes) designs employ driver circuits including a current mode logic (CML) driver, a voltage mode driver, and an H-bridge current mode driver having a resistor coupled between a differential output terminals (referred to hereinafter as an H-bridge driver). However, the CML driver consumes more power. The voltage mode driver lacks design flexibility and is therefore unsuitable for transmitter (TX) equalizer design. Power efficiency of the H-bridge driver is higher than that of the CML driver but still lower than that of the voltage mode driver.

Thus, there is a need for a driver circuit having low power consumption and high design flexibility.

SUMMARY

In accordance with exemplary embodiments of the present invention, a driver circuit capable of referring to data logic to couple reference voltage(s) and reference current(s) to a termination element and a related control method thereof are proposed to solve the above-mentioned problem.

According to an embodiment of the present invention, an exemplary driver circuit for receiving a first data input and generating an output signal to a termination element according to at least the first data input is disclosed. The exemplary driver circuit comprises a pair of differential output terminals, a first current mode drive unit and a voltage mode drive unit. The pair of differential output terminals is arranged for outputting the output signal. The pair of differential output terminals has a first output terminal and a second output terminal. The first current mode drive unit is coupled to the pair of differential output terminals, and is arranged for generating a first reference current, outputting the first reference current from one of the first output terminal and the second output terminal according to the first data input, and receiving the first reference current from the other of the first output terminal and the second output terminal according to the first data input. The voltage mode drive unit is coupled to the pair of differential output terminals, and is arranged for providing a first reference voltage and a second reference voltage different from the first reference voltage, coupling the first reference voltage to one of the first output terminal and the second output terminal according to the first data input, and coupling the second reference voltage to the other of the first output terminal and the second output terminal according to the first data input.

According to another embodiment of the present invention, an exemplary control method of a driver circuit is disclosed. The driver circuit receives a first data input and generates an output signal to a termination element according to at least the first data input. The driver circuit comprises a pair of differential output terminals for outputting the output signal. The pair of differential output terminals has a first output terminal and a second output terminal. The control method comprises the following steps: generating a first reference current; outputting the first reference current from one of the first output terminal and the second output terminal according to the first data input, and receiving the first reference current from the other of the first output terminal and the second output terminal according to the first data input; providing a first reference voltage and a second reference voltage different from the first reference voltage; and coupling the first reference voltage to one of the first output terminal and the second output terminal according to the first data input, and coupling the second reference voltage to the other of the first output terminal and the second output terminal according to the first data input.

According to another embodiment of the present invention, an exemplary driver circuit for receiving a first data input and generating an output signal to a termination element according to at least the first data input is disclosed. The exemplary driver circuit comprises a first output terminal, a first current mode drive unit and a first voltage mode drive unit. The first output terminal is arranged for outputting the output signal. The first current mode drive unit is coupled to the first output terminal, and is arranged for generating a first reference current, selectively outputting the first reference current from the first output terminal to the termination element according to the first data input, and selectively receiving the first reference current through the first output terminal according to the first data input, wherein when the first current mode drive unit outputs the first reference current, the first current mode drive unit steers the first reference current to flow into the termination element such that the first reference current outputted from the first current mode drive unit flows through the termination element and is used as at least a portion of a current flowing through the termination element. The first voltage mode drive unit is coupled to the first output terminal, and is arranged for coupling one of a first reference voltage and a second reference voltage to the first output terminal according to the first data input, wherein the first reference voltage is different from the second reference voltage.

According to another embodiment of the present invention, an exemplary control method of a driver circuit is disclosed. The driver circuit receives a data input and generates an output signal to a termination element according to at least the data input. The driver circuit comprises a first output terminal for outputting the output signal. The control method comprises the following steps: generating a reference current; selectively outputting the reference current from the first output terminal to the termination element according to the data input, and selectively receiving the first reference current through the first output terminal according to the first data input; when the reference current is outputted, steering the reference current to flow into the termination element such that the reference current outputted from the first current mode drive unit flows through the termination element and is used as at least a portion of a current flowing through the termination element; and coupling one of a first reference voltage and a second reference voltage to the first output terminal according to the data input, wherein the first reference voltage is different from the second reference voltage.

These and other objectives of the present invention will no doubt become obvious to those of ordinary skill in the art after reading the following detailed description of the preferred embodiment that is illustrated in the various figures and drawings.

DETAILED DESCRIPTION

In order to meet low power and high flexibility requirements, the proposed driver circuit may provide a reference current and a plurality of reference voltages, wherein when the reference current is outputted from one of a pair of differential output terminals according to data logic, the reference voltages may be coupled to different output terminals of the pair of differential output terminals, respectively, thus implementing a driver architecture consuming less power. The power consumption of the proposed driver circuit may be even less than that of a voltage mode driver. In addition to a differential driver circuit, the proposed driver control mechanism may be employed in a single-ended driver circuit. Further, the proposed driver control mechanism may be employed in multi-level driver and a transmit finite impulse response (FIR) equalizer. Moreover, the proposed driver circuit may be employed in equalizer architecture due to high design flexibility. To facilitate an understanding of the present invention, an exemplary implementation of a driver circuit of a SerDes transmitter is given in the following for further description of the proposed power control mechanism. However, a person skilled in the art should understand that this is not meant to be a limitation of the present invention.

Figure 1:
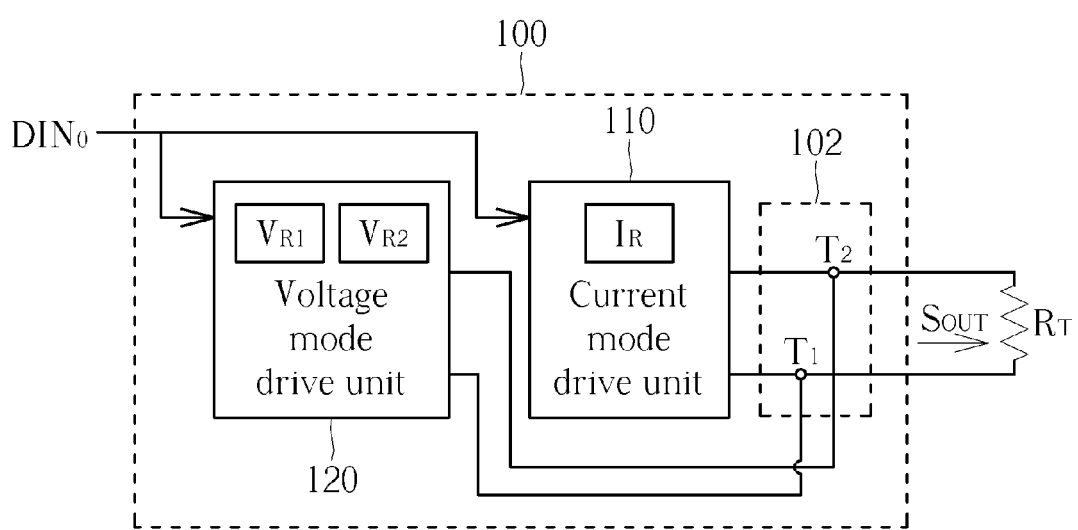
FIG. 1 is a block diagram illustrating an exemplary driver circuit according to an embodiment of the present invention.

Please refer to FIG. 1, which is a block diagram illustrating an exemplary driver circuit according to an embodiment of the present invention. By way of example but not limitation, the driver circuit 100 may be employed in a SerDes transmitter (not shown in FIG. 1). Specifically, the driver circuit 100 may receive a data input $DIN_0$ and generate an output signal $S_{OUT}$ to a termination element (implemented by a termination resistor $R_T$ in this embodiment) according to the data input $DIN_0$, wherein the termination resistor $R_T$ may be located in a SerDes receiver (not shown in FIG. 1). The driver circuit 100 may include a pair of differential output terminals 102 (having an output terminal $T_1$ and an output terminal $T_2$), a current mode drive unit 110 and a voltage mode drive unit 120. The output signal $S_{OUT}$ may be regarded as a voltage difference between the output terminal $T_1$ and the output terminal $T_2$, and correspond to an output data logic (e.g. a logic "1" corresponding to a positive voltage or a logic "0" corresponding to a negative voltage).

The current mode drive unit 110 is coupled to the pair of differential output terminals 102, and is arranged for generating a reference current $I_R$, wherein the current mode drive unit 110 may output the reference current $I_R$ from one of the output terminal $T_1$ and the output terminal $T_2$ according to the data input $DIN_0$, and receive the reference current $I_R$ from the other of the output terminal $T_1$ and the output terminal $T_2$ according to the data input $DIN_0$. Specifically, after the reference current $I_R$ is outputted from one of the output terminal $T_1$ and the output terminal $T_2$, the reference current $I_R$ may flow through the termination resistor $R_T$ first, and then flows into the current mode drive unit 110 through the other of the output terminal $T_1$ and the output terminal $T_2$. In other words, the current mode drive unit 110 may change a direction of the reference current $I_R$ through the termination resistor $R_T$, thereby changing respective electric potentials of the output terminal $T_1$ and the output terminal $T_2$.

Additionally, in a case where the current mode drive unit 110 outputs the reference current $I_R$ from the output terminal $T_1$ and receives the reference current $I_R$ from the output terminal $T_2$, as a voltage of the output terminal $T_1$ is greater than a voltage of the output terminal $T_2$, the output signal $S_{OUT}$ may correspond to a specific output data logic (e.g. a logic "1"). In another case where the current mode drive unit 110 outputs the reference current $I_R$ from the output terminal $T_2$ and receives the reference current $I_R$ from the output terminal $T_1$, the output signal $S_{OUT}$ may correspond to another specific output data logic (e.g. a logic "0"). Please note that a voltage difference between the output terminal $T_1$ and the output terminal $T_2$ may be a voltage drop across the termination resistor $R_T$ due to the reference current $I_R$ flowing therethrough, which implies that an output current of the current mode drive unit 110 may be effectively provided for the SerDes receiver.

The voltage mode drive unit 120 is coupled to the pair of differential output terminals 102, and is arranged for providing a reference voltage $V_{R1}$ and a reference voltage $V_{R2}$ different from the reference voltage $V_{R1}$, wherein the voltage mode drive unit 120 may couple the reference voltage $V_{R1}$ to one of the output terminal $T_1$ and the output terminal $T_2$ according to the data input $DIN_0$, and couple the reference voltage $V_{R2}$ to the other of the output terminal $T_1$ and the output terminal $T_2$ according to the data input $DIN_0$. Specifically, the reference voltage $V_{R1}$ and the reference voltage $V_{R2}$ may be provided for two output terminals of the pair of differential output terminals 102, respectively, so that the output terminal $T_1$ and the output terminal $T_2$ may have different electric potentials to provide an output voltage required by the SerDes receiver.

For example, in a case where the reference voltage $V_{R1}$ is greater than the reference voltage $V_{R2}$, when the reference voltage $V_{R1}$ is coupled to the output terminal $T_1$ and the reference voltage $V_{R2}$ is coupled to the output terminal $T_2$, the output signal $S_{OUT}$ may correspond to a specific output data logic (e.g. a logic "1"); and when the reference voltage $V_{R1}$ is coupled to the output terminal $T_2$ and the reference voltage $V_{R2}$ is coupled to the output terminal $T_1$, the output signal $S_{OUT}$ may correspond to another specific output data logic (e.g. a logic "0"). It should be noted that electric potential of one of the output terminal $T_1$ and the output terminal $T_2$ may be equal to the reference voltage $V_{R1}$, and electric potential of the other of the output terminal $T_1$ and the output terminal $T_2$ may be equal to the reference voltage $V_{R2}$, which implies that an output voltage of the voltage mode drive unit 120 may be effectively provided for the pair of differential output terminals 102.

In view of above, the current mode drive unit 110 may provide the output current effectively, and the voltage mode drive unit 120 may provide the output voltage effectively. Hence, a power efficient driver circuit can be provided. For example, in a case where the reference voltage $V_{R1}$ is greater than the reference voltage $V_{R2}$, when the current mode drive unit 110 outputs the reference current $I_R$ from the output terminal $T_1$ and receives reference current $I_R$ from the output terminal $T_2$ according to the data input $DIN_0$, the voltage mode drive unit 120 may couple the reference voltage $V_{R1}$ to the output terminal $T_1$ and couple the reference voltage $V_{R2}$ to the output terminal $T_2$ according to the data input $DIN_0$. Hence, when electric potential of one of the output terminal $T_1$ and the output terminal $T_2$ is equal to the reference voltage $V_{R1}$, electric potential of the other of the output terminal $T_1$ and the output terminal $T_2$ is equal to the reference voltage $V_{R2}$, and a voltage difference between the reference voltage $V_{R1}$ and the reference voltage $V_{R2}$ is equal to a voltage drop across the termination resistor $R_T$ due to the reference current $I_R$ flowing therethrough, a drive current outputted from the driver circuit 100 may be provided by the current mode drive unit 110 only, thus greatly reducing power consumption.

The above is for illustrative purposes only, and is not meant to be a limitation of the present invention. In on implementation, the drive current outputted from the driver circuit 100 may come from the current mode drive unit 110 and the voltage mode drive unit 120. In other words, the drive current outputted from the driver circuit 100 may be a sum of the reference current $I_R$ and an output current of the voltage mode drive unit 120, wherein a ratio of the reference current $I_R$ to the drive current outputted from the driver circuit 100 may adjusted according to actual requirements/considerations.

Additionally, the reference voltage $V_{R1}$ and/or the reference voltage $V_{R2}$ provided by the voltage mode drive unit 120 may be generated within the driver circuit 100 or generated by a circuit external to driver circuit 100. For example, the voltage mode drive unit 120 may include a voltage generation circuit (not shown in FIG. 1), which is used for generating at least one of the reference voltage $V_{R1}$ and the reference voltage $V_{R2}$. In another example, at least one of the reference voltage $V_{R1}$ and the reference voltage $V_{R2}$ may be directly provided by a voltage generation circuit external coupled to the driver circuit 100, such as a system power supply or a ground terminal. In other words, the voltage mode drive unit 120 may provide the reference voltage $V_{R1}$ and the reference voltage $V_{R2}$ by coupling a voltage, supplied from an external circuit, to output terminal(s) of a differential pair of output terminals.

Figure 2:
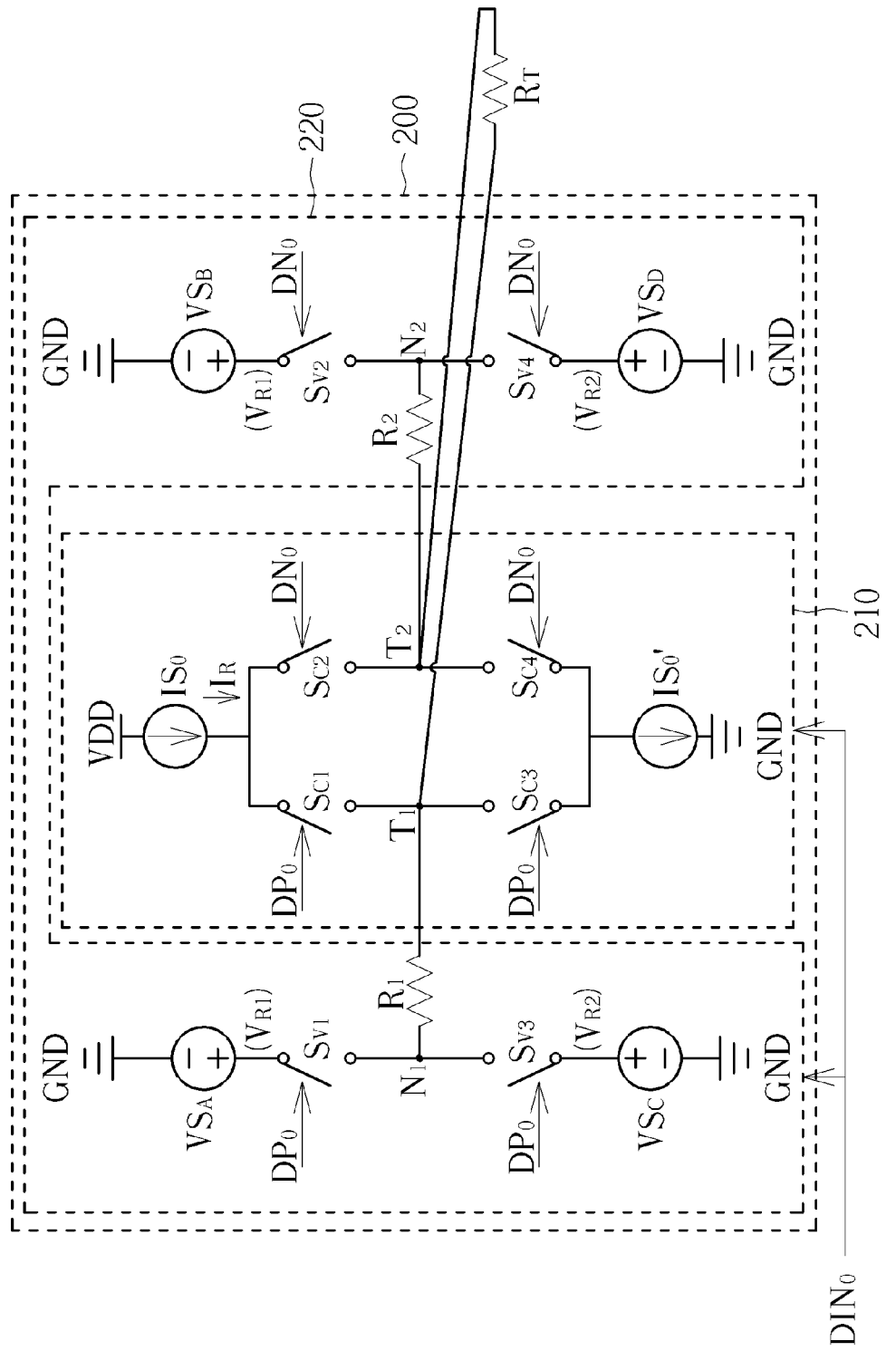
FIG. 2 is a diagram illustrating a first implementation of the driver circuit shown in FIG. 1.

FIG. 2 is a diagram illustrating a first implementation of the driver circuit 100 shown in FIG. 1. In this implementation, the driver circuit 200 may include the output terminals $T_1$ and $T_2$ shown in FIG. 1 (i.e. a pair of differential output terminals), a current mode drive unit 210 and a voltage mode drive unit 220, wherein the current mode drive unit 110 and the voltage mode drive unit 120 shown in FIG. 1 may be implemented by the current mode drive unit 210 and the voltage mode drive unit 220, respectively. Additionally, a symbol VDD denotes a direct current (DC) power required by circuit elements, and a symbol GND denotes a reference voltage node (e.g. a common ground).

The current mode drive unit 210 may include a current source $IS_0$ and a current sink $IS_0'$. The current source $IS_0$ may be arranged for generating the reference current $I_R$, and the current sink $IS_0'$ may be arranged for receiving the reference current $I_R$, wherein the current source $IS_0$ may be coupled to one of the output terminal $T_1$ and the output terminal $T_2$ according to the data input $DIN_0$, and the current sink $IS_0'$ may be coupled to the other of the output terminal $T_1$ and the output terminal $T_2$ according to the data input $DIN_0$.

In this implementation, the current mode drive unit 210 may include further include a plurality of switches $S_{C1}$-$S_{C4}$, wherein the switch $S_{C1}$ may be selectively coupled between the current source IS and the output terminal $T_1$ according to the data input $DIN_0$; the switch $S_{C2}$ may be selectively coupled between the current source $IS_0$ and the output terminal $T_2$ according to the data input $DIN_0$; the switch $S_{C3}$ may be selectively coupled between the current sink $IS_0'$ and the output terminal $T_1$ according to the data input $DIN_0$; and the switch $S_{C4}$ may be selectively coupled between the current sink $IS_0'$ and the output terminal $T_2$ according to the data input $DIN_0$. When the switch $S_{C1}$ and the switch $S_{C4}$ are switched on due to the data input $DIN_0$, the switch $S_{C2}$ and the switch $S_{C3}$ are switched off; and when the switch $S_{C1}$ and the switch $S_{C4}$ are switched off due to the data input $DIN_0$, the switch $S_{C2}$ and the switch $S_{C3}$ are switched on. Hence, the current source IS may output the reference current $I_R$ from one of the output terminal $T_1$ and the output terminal $T_2$, and the current sink $IS_0'$ may draw the reference current $I_R$ from the other of the output terminal $T_1$ and the output terminal $T_2$.

For example, the data input $DIN_0$ may include a data signal $DP_0$ and a data signal $DN_0$, wherein the data signal $DP_0$ and the data signal $DN_0$ may be inverted with respect to each other, or non-overlapping signals. The data signal $DP_0$ may control switch states of the switches $S_{C1}$ and $S_{C3}$, wherein when one of the switches $S_{C1}$ and $S_{C3}$ is switched on, the other of the switches $S_{C1}$ and $S_{C3}$ is switched off. The data signal $DN_0$ may control switch states of the switches $S_{C2}$ and $S_{C4}$, wherein when one of the switches $S_{C2}$ and $S_{C4}$ is switched on, the other of the switches $S_{C2}$ and $S_{C4}$ is switched off. Further, when the switch $S_{C1}$ is switched on due to the data signal $DP_0$, the switch $S_{C2}$ is switched off due to the data signal $DN_0$, and when the switch $S_{C1}$ is switched off due to the data signal $DP_0$, the switch $S_{C2}$ is switched on due to the data signal $DN_0$.

Based on the aforementioned switch operations, the current source IS may output the reference current $I_R$ from one of the output terminal $T_1$ and the output terminal $T_2$ according to the data input $DIN_0$, and current sink $IS_0'$ may draw the reference current $I_R$ from the other of the output terminal $T_1$ and the output terminal $T_2$ according to the data input $DIN_0$. Please note that the aforementioned architecture and switch control signals of the current mode drive unit 210 are for illustrative purposes, and are not meant to be limitations of the present invention. For example, the switches $S_{C1}$ and $S_{C2}$ (or the switches $S_{C3}$ and $S_{C4}$) may be replaced by a three-way switch. As long as the current mode drive unit 210 may output the reference current $I_R$ from one of the output terminal $T_1$ and the output terminal $T_2$ and receive the reference current $I_R$ from the other of the output terminal $T_1$ and the output terminal $T_2$ according to the data input $DIN_0$, other variations and modifications fall within the spirit and scope of the present invention.

The voltage mode drive unit 220 may include a plurality of voltage sources $VS_A$-$VS_D$, a plurality of switches $S_{V1}$-$S_{V4}$, and a plurality of impedance elements (implemented by resistors $R_1$ and $R_2$ in this implementation). The voltage sources $VS_A$ and $VS_B$ may be used to generate the reference voltage $V_{R1}$ shown in FIG. 1, and the voltage sources $VS_C$ and $VS_D$ may be used to generate the reference voltage $V_{R2}$ shown in FIG. 1. The resistor $R_1$ is coupled between a node $N_1$ and the output terminal $T_1$, and the resistor $R_2$ is coupled between a node $N_2$ and the output terminal $T_2$, wherein the node $N_1$ may be coupled to the reference voltage $V_{R1}$ through the switch $S_{V1}$ or coupled to the reference voltage $V_{R2}$ through the switch $S_{V3}$ according to the data input $DIN_0$, and the node $N_2$ may be coupled to the reference voltage $V_{R1}$ through the switch $S_{V2}$ or coupled to the reference voltage $V_{R2}$ through the switch $S_{V4}$ according to the data input $DIN_0$. To put it differently, the switch $S_{V1}$ may be selectively coupled between the reference voltage $V_{R1}$ (the voltage source $VS_A$) and the output terminal $T_1$ (through the resistor $R_1$) according to the data input $DIN_0$; the switch $S_{V2}$ may be selectively coupled between the reference voltage $V_{R1}$ (the voltage source $VS_B$) and the output terminal $T_2$ (through the resistor $R_2$) according to the data input $DIN_0$; the switch $S_{V3}$ may be selectively coupled between the reference voltage $V_{R2}$ (the voltage source $VS_C$) and the output terminal $T_1$ (through the resistor $R_1$) according to the data input $DIN_0$; and the switch $S_{V4}$ may be selectively coupled between the reference voltage $V_{R2}$ (the voltage source $VS_D$) and the output terminal $T_2$ (through the resistor $R_2$) according to the data input $DIN_0$.

In this implementation, when the switch $S_{V1}$ and the switch $S_{V4}$ are switched on due to the data input $DIN_0$, the switch $S_{V2}$ and the switch $S_{V3}$ are switched off; and when the switch $S_{V1}$ and the switch $S_{V4}$ are switched off due to the data input $DIN_0$, the switch $S_{V2}$ and the switch $S_{V3}$ are switched on. For example, the data signal $DP_0$ may control switch states of the switches $S_{V1}$ and $S_{V3}$, wherein when one of the switches $S_{V1}$ and $S_{V3}$ is switched on, the other of the switches $S_{V1}$ and $S_{V3}$ is switched off. Additionally, the data signal $DN_0$ may control switch states of the switches $S_{V2}$ and $S_{V4}$, wherein when one of the switches $S_{V2}$ and $S_{V4}$ is switched on, the other of the switches $S_{V2}$ and $S_{V4}$ is switched off. Further, when the switch $S_{V1}$ is switched on due to the data signal $DP_0$, the switch $S_{V2}$ is switched off due to the data signal $DN_0$, and when the switch $S_{V1}$ is switched off due to the data signal $DP_0$, the switch $S_{V2}$ is switched on due to the data signal $DN_0$.

Figure 3:
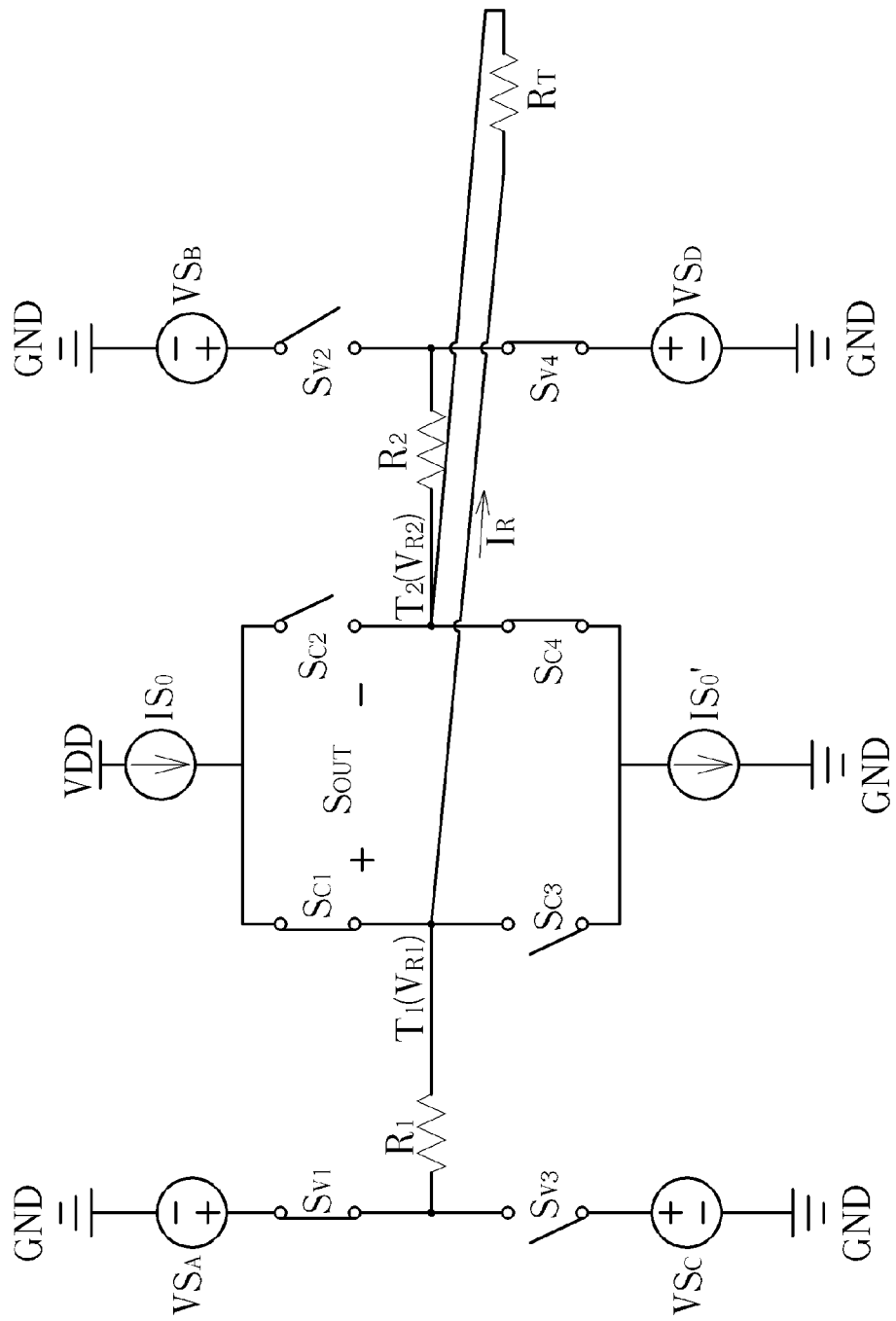
FIG. 3 is a diagram illustrating an exemplary output operation of the driver circuit shown in FIG. 2.
Figure 4:
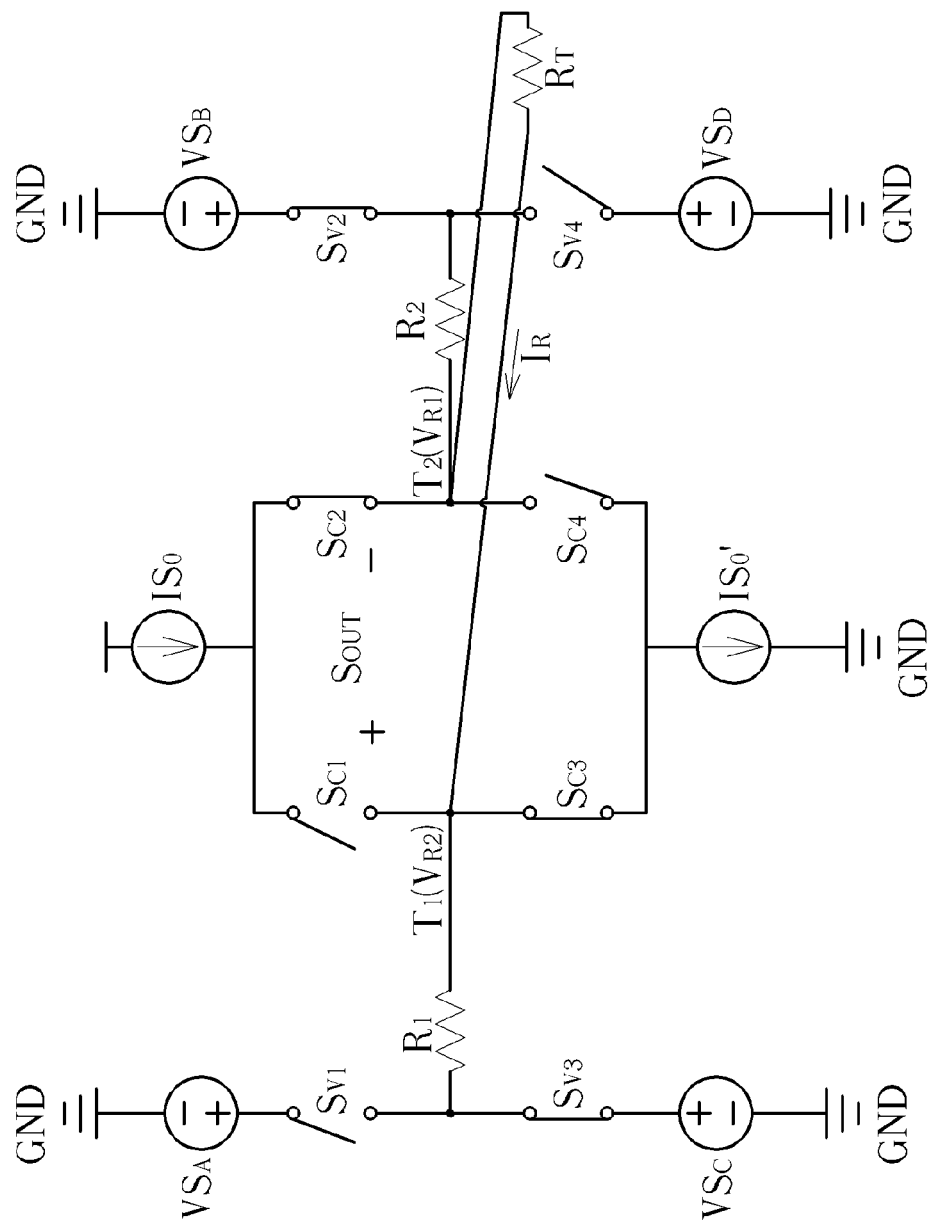
FIG. 4 is a diagram illustrating another exemplary output operation of the driver circuit shown in FIG. 2.

Based on the aforementioned switch operations, one terminal of the resistor $R_1$ (the node $N_1$) may be coupled to one of the reference voltage $V_{R1}$ and the reference voltage $V_{R2}$ according to the data input $DIN_0$, and one terminal of the resistor $R_2$ (the node $N_2$) may be coupled to the other of the reference voltage $V_{R1}$ and the reference voltage $V_{R2}$ according to the data input $DIN_0$. Please refer to FIG. 3 and FIG. 4. FIG. 3 is a diagram illustrating an exemplary output operation of the driver circuit 200 shown in FIG. 2, and FIG. 4 is a diagram illustrating another exemplary output operation of the driver circuit 200 shown in FIG. 2. For illustrative purposes, a voltage difference obtained by subtracting a voltage of the output terminal $T_2$ from a voltage of the output terminal $T_1$ is used as the output signal $S_{OUT}$ in the embodiments shown in FIG. 3 and FIG. 4. Hence, when the voltage of the output terminal $T_1$ is greater than the voltage of the output terminal $T_2$, the output signal $S_{OUT}$ corresponds to a data logic "1"; and when the voltage of the output terminal $T_1$ is less than the voltage of the output terminal $T_2$, the output signal $S_{OUT}$ corresponds to a data logic "0". Additionally, it is assumed that the reference voltage $V_{R1}$ generated by the voltage sources $VS_A$ and $VS_B$ is greater than the reference voltage $V_{R2}$ generated by the voltage sources $VS_C$ and $VS_D$. Please note that the aforementioned definition of the data logic and a magnitude relationship between the reference voltages are for illustrative purposes only, and are not meant to be limitations of the present invention.

In the embodiment shown in FIG. 3, the reference current $I_R$ generated from the current source $IS_0$ may be outputted from the output terminal $T_1$ to the termination resistor $R_T$ through the switch $S_{C1}$, and then flow into the current sink $IS_0'$ through the output terminal $T_2$ and the switch $S_{C4}$. Additionally, the switches $S_{V1}$ and $S_{V4}$ are switched on, allowing the reference voltage $V_{R1}$ (a high voltage) and the reference voltage $V_{R2}$ (a low voltage) to be coupled to the output terminal $T_1$ and the output terminal $T_2$ respectively. The output signal $S_{OUT}$ may correspond to a data logic "1". In the embodiment shown in FIG. 4, the reference current $I_R$ generated from the current source $IS_0$ may be outputted from the output terminal $T_2$ to the termination resistor $R_T$ through the switch $S_{C2}$, and then flow into the current sink $IS_0'$ through the output terminal $T_1$ and the switch $S_{C3}$. The switches $S_{V2}$ and $S_{V3}$ are switched on, allowing the reference voltage $V_{R1}$ and the reference voltage $V_{R2}$ to be coupled to the output terminal $T_2$ and the output terminal $T_1$ respectively. The output signal $S_{OUT}$ may correspond to a data logic "0".

It should be noted that, if a voltage difference between respective voltages provided by the voltage sources $VS_A$ and $VS_D$ is equal to a voltage drop across the termination resistor $R_T$ due to the reference current $I_R$ flowing through the termination resistor $R_T$, no current flows through the resistors $R_1$ and $R_2$. In other words, the voltage mode drive unit 220 may provide electric potentials for the output terminal $T_1$ and the output terminal $T_2$ without causing a power loss. Further, as the output terminal $T_1$ and the output terminal $T_2$ are a pair of differential output terminals, the resistor $R_1$ and the resistor $R_2$ may have the same impedance value to improve the quality of differential output signals.

The aforementioned architecture and switch control signals of the voltage mode drive unit 220 are for illustrative purposes, and are not meant to be limitations of the present invention. For example, the switches $S_{V1}$ and $S_{V3}$ (or the switches $S_{V2}$ and $S_{V4}$) may be replaced by a three-way switch, thus allowing the node $N_1$ to be coupled to one of the reference voltage $V_{R1}$ and the reference voltage $V_{R2}$ according to the data input $DIN_0$, and allowing the node $N_2$ to be coupled to the other of the reference voltage $V_{R1}$ and the reference voltage $V_{R2}$ according to the data input $DIN_0$. In another example, the voltage sources $VS_A$ and $VS_B$ may be implemented by a single voltage source, and/or the voltage sources $VS_C$ and $VS_D$ may be implemented by a single voltage source. Further, the reference voltage $V_{R1}$ and the reference voltage $V_{R2}$ may be coupled to the corresponding output terminals through other circuit topologies. Please refer to FIG. 5, which is a diagram illustrating a second implementation of the driver circuit 100 shown in FIG. 1. The architecture of the driver circuit 500 is based on that of the driver circuit 200 shown in FIG. 2, wherein the main difference is the circuit topology of the voltage mode drive unit. The driver circuit 500 may include the output terminals $T_1$ and $T_2$ shown in FIG. 1, the current mode drive unit 210 shown in FIG. 2, and a voltage mode drive unit 520. The voltage mode drive unit 520 may be used to implement the voltage mode drive unit 120 shown in FIG. 1.

The voltage mode drive unit 520 may include the switches $S_{V1}$-$S_{V4}$ shown in FIG. 2, a plurality of voltage sources $VS_0$ and $VS_0'$, and a plurality of impedance elements (implemented by a plurality of resistors $R_A$-$R_D$ in this implementation). The voltage sources $VS_0$ and $VS_0'$ may generate the reference voltages $V_{R1}$ and $V_{R2}$ shown in FIG. 1, respectively. The resistor $R_A$ is coupled between a node $N_A$ and the output terminal $T_1$, and the resistor $R_B$ is coupled between a node $N_B$ and the output terminal $T_2$, wherein the reference voltage $V_{R1}$ (the voltage source $VS_0$) may be coupled to the node $N_A$ through the switch $S_{V1}$ or coupled to the node $N_B$ through the switch $S_{V2}$ according to the data input $DIN_0$. The resistor $R_C$ is coupled between a node $N_C$ and the output terminal $T_1$, and the resistor $R_D$ is coupled between a node $N_D$ and the output terminal $T_2$, wherein the reference voltage $V_{R2}$ (the voltage source $VS_0'$) may be coupled to the node $N_C$ through the switch $S_{V3}$ or coupled to the node $N_D$ through the switch $S_{V4}$ according to the data input $DIN_0$. In other words, the switch $S_{V1}$ may be selectively coupled between the reference voltage $V_{R1}$ and the output terminal $T_1$ (through the resistor $R_A$), the switch $S_{V2}$ may be selectively coupled between the reference voltage $V_{R1}$ and the output terminal $T_2$ (through the resistor $R_B$), the switch $S_{V3}$ may be selectively coupled between the reference voltage $V_{R2}$ and the output terminal $T_1$ (through the resistor $R_C$), and the switch $S_{V4}$ may be selectively coupled between the reference voltage $V_{R2}$ and the output terminal $T_2$ (through the resistor $R_D$).

In this implementation, when the switch $S_{V1}$ and the switch $S_{V4}$ are switched on due to the data input $DIN_0$, the switch $S_{V2}$ and the switch $S_{V3}$ are switched off; and when the switch $S_{V1}$ and the switch $S_{V4}$ are switched off due to the data input $DIN_0$, the switch $S_{V2}$ and the switch $S_{V3}$ are switched on. For example, the data signal $DP_0$ may control switch states of the switches $S_{V1}$ and $S_{V3}$, wherein when one of the switches $S_{V1}$ and $S_{V3}$ is switched on, the other of the switches $S_{V1}$ and $S_{V3}$ is switched off. Additionally, the data signal $DN_0$ may control switch states of the switches $S_{V2}$ and $S_{V4}$, wherein when one of the switches $S_{V2}$ and $S_{V4}$ is switched on, the other of the switches $S_{V2}$ and $S_{V4}$ is switched off. Further, when the switch $S_{V1}$ is switched on due to the data signal $DP_0$, the switch $S_{V2}$ is switched off due to the data signal $DN_0$, and when the switch $S_{V1}$ is switched off due to the data signal $DP_0$, the switch $S_{V2}$ is switched on due to the data signal $DN_0$.

Figure 5:
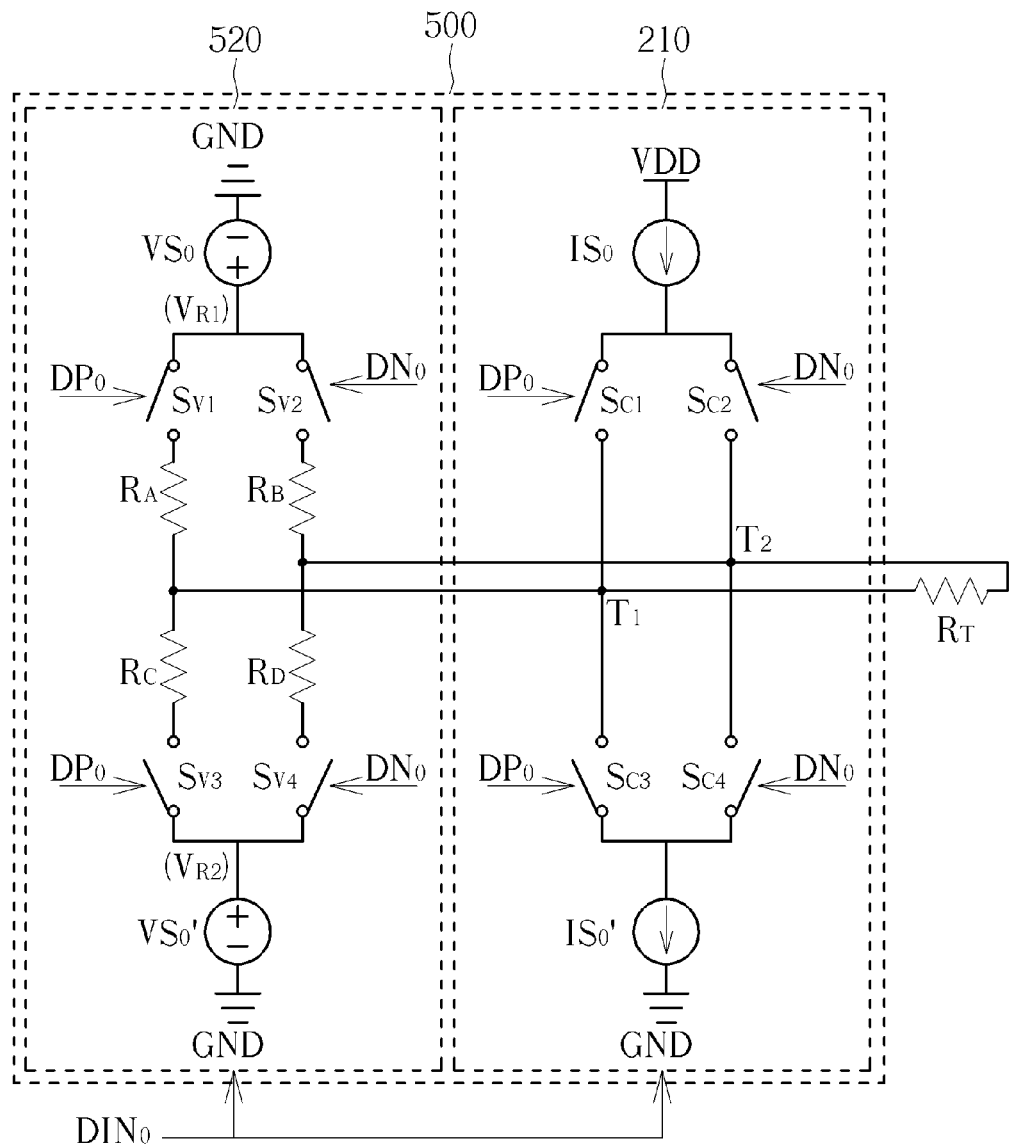
FIG. 5, which is a diagram illustrating a second implementation of the driver circuit shown in FIG. 1.
Figure 6:
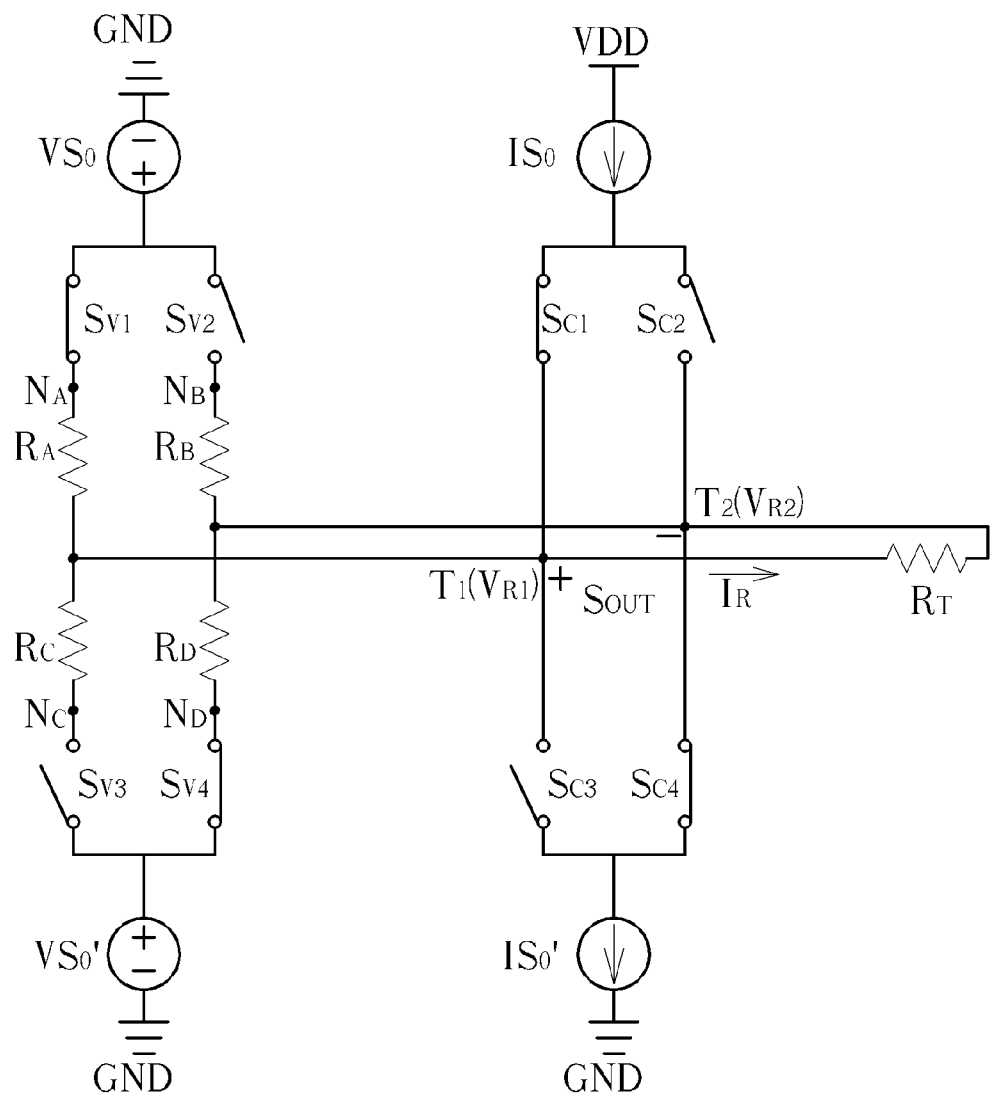
FIG. 6 is a diagram illustrating an exemplary output operation of the driver circuit shown in FIG. 5.
Figure 7:
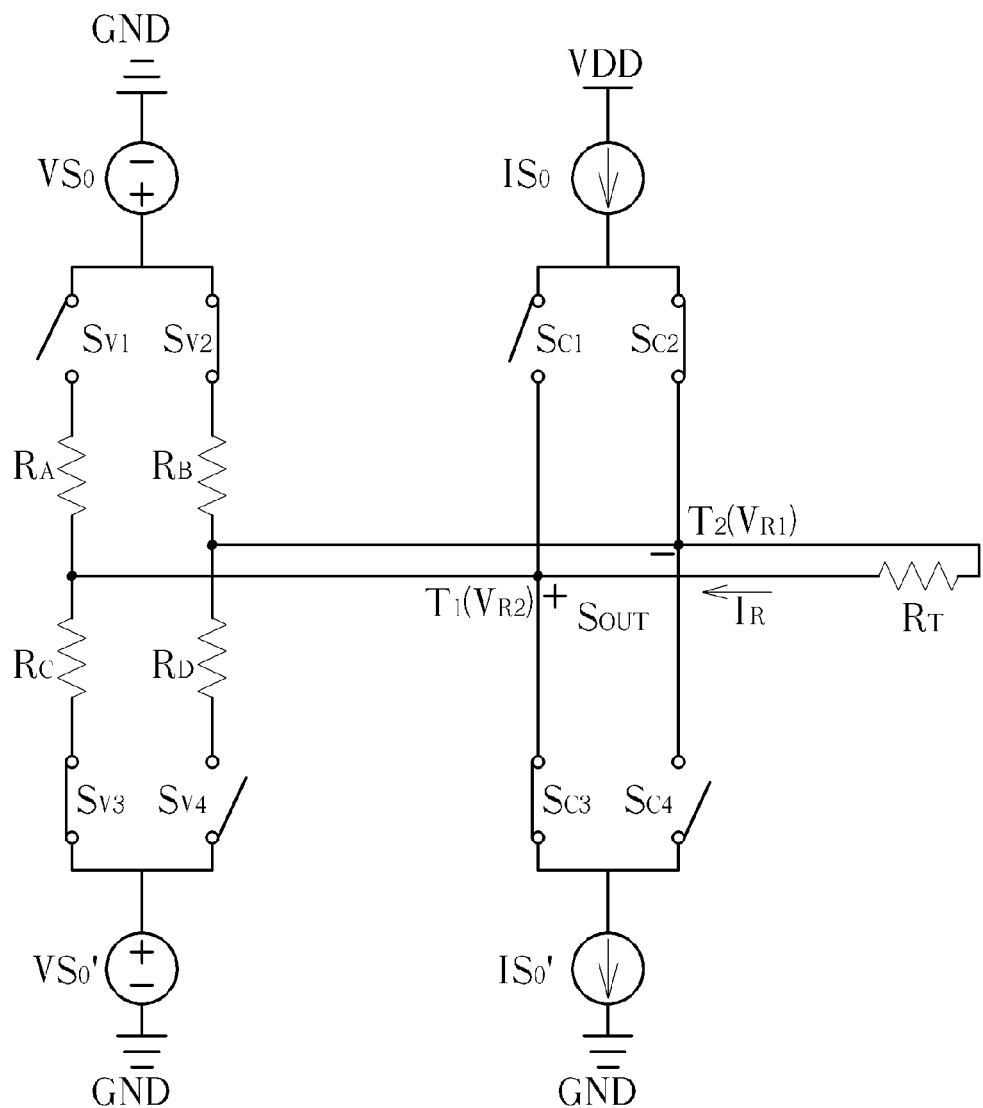
FIG. 7 is a diagram illustrating another exemplary output operation of the driver circuit shown in FIG. 5.

Based on the aforementioned switch operations, when the reference voltage $V_{R1}$ is coupled to one terminal of the resistor $R_A$ (the node $N_A$), the reference voltage $V_{R2}$ is coupled to one terminal of the resistor $R_D$ (the node $N_D$). In addition, when the reference voltage $V_{R1}$ is coupled to one terminal of the resistor $R_B$ (the node $N_B$), the reference voltage $V_{R2}$ is coupled to one terminal of the resistor $R_C$ (the node $N_C$). Please refer to FIG. 6 and FIG. 7. FIG. 6 is a diagram illustrating an exemplary output operation of the driver circuit 500 shown in FIG. 5, and FIG. 7 is a diagram illustrating another exemplary output operation of the driver circuit 500 shown in FIG. 5. As switch operations shown in FIG. 6 is similar to those shown in FIG. 3, and switch operations shown in FIG. 7 is similar to those shown in FIG. 4, similar descriptions are not repeated here for brevity. Please note that, if a voltage difference between respective voltages provided by the voltage sources $VS_0$ and $VS_0'$ is equal to a voltage drop across the termination resistor $R_T$ due to the reference current $I_R$ flowing therethrough, no current flows through the resistors $R_A$ and $R_D$ (or the resistors $R_B$ and $R_C$). In other words, the voltage mode drive unit 520 shown in FIG. 5 may provide electric potentials for the output terminals $T_1$ and $T_2$ without causing a power loss. Further, as the output terminals $T_1$ and $T_2$ are a pair of differential output terminals, the resistors $R_A$ and $R_D$ (or the resistors $R_B$ and $R_C$) may have the same impedance value to improve the quality of differential output signals.

The aforementioned architecture and switch control signals of the voltage mode drive unit 520 are for illustrative purposes, and are not meant to be limitations of the present invention. For example, the switches $S_{V1}$ and $S_{V2}$ (or the switches $S_{V3}$ and $S_{V4}$) may be replaced by a three-way switch, thus allowing the reference voltage $V_{R1}$ to be coupled to one of the node $N_A$ and the node $N_B$ according to the data input $DIN_0$, and allowing the reference voltage $V_{R2}$ to be coupled to one of the node $N_C$ and the node $N_D$ according to the data input $DIN_0$. Further, the reference voltage $V_{R1}$ and the reference voltage $V_{R2}$ may be directly/indirectly coupled to the corresponding output terminals through other circuit topologies. In brief, as long as a voltage mode drive unit (e.g. the voltage mode drive unit 220/520) may couple the reference voltage $V_{R1}$ to one of the output terminal $T_1$ and the output terminal $T_2$ and couple the reference voltage $V_{R2}$ to the other of the output terminal $T_1$ and the output terminal $T_2$ according to the data input $DIN_0$, other variations and modifications fall within the spirit and scope of the present invention.

Figure 8:
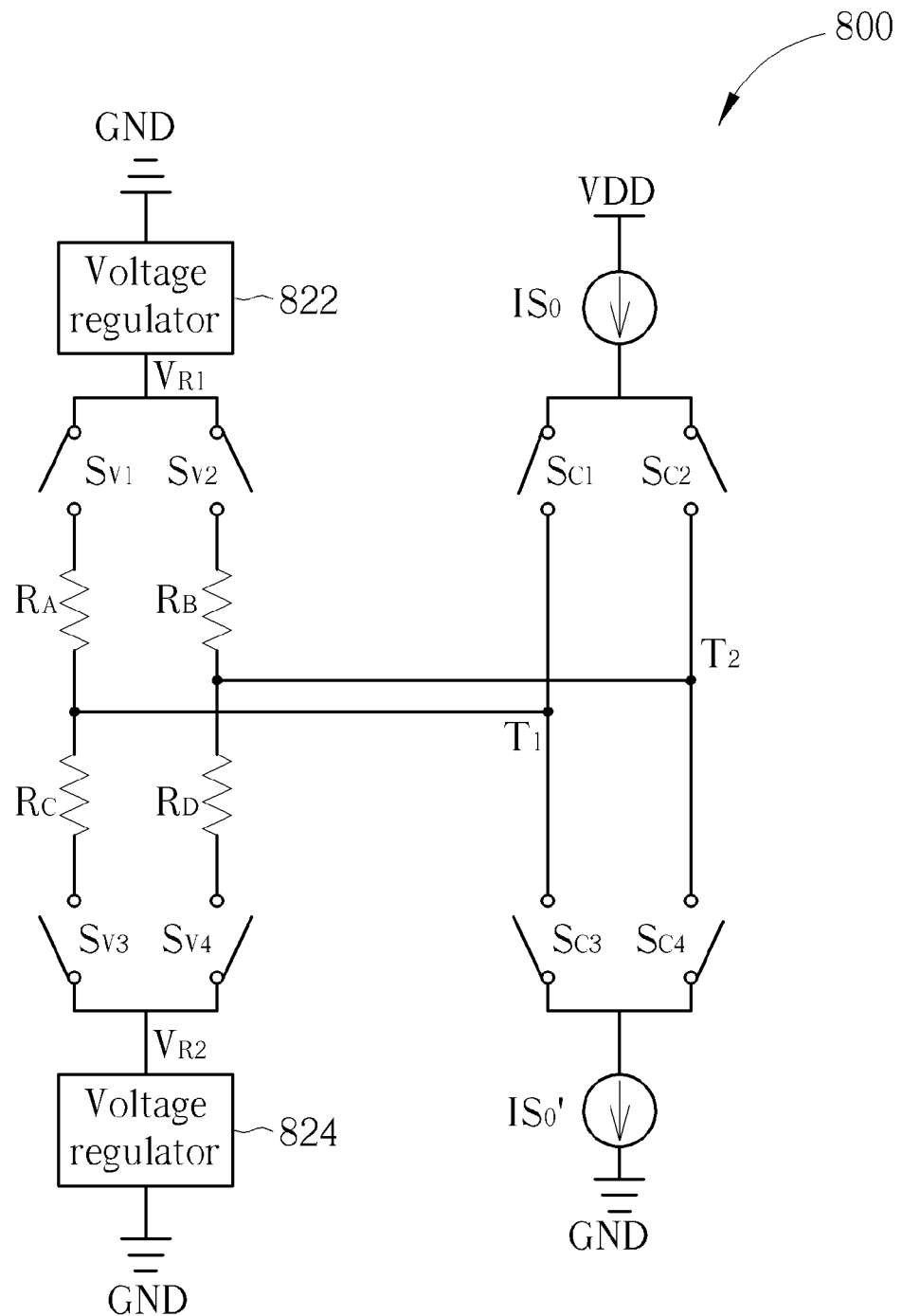
FIG. 8 is a first alternative design of the driver circuit shown in FIG. 5.
Figure 9:
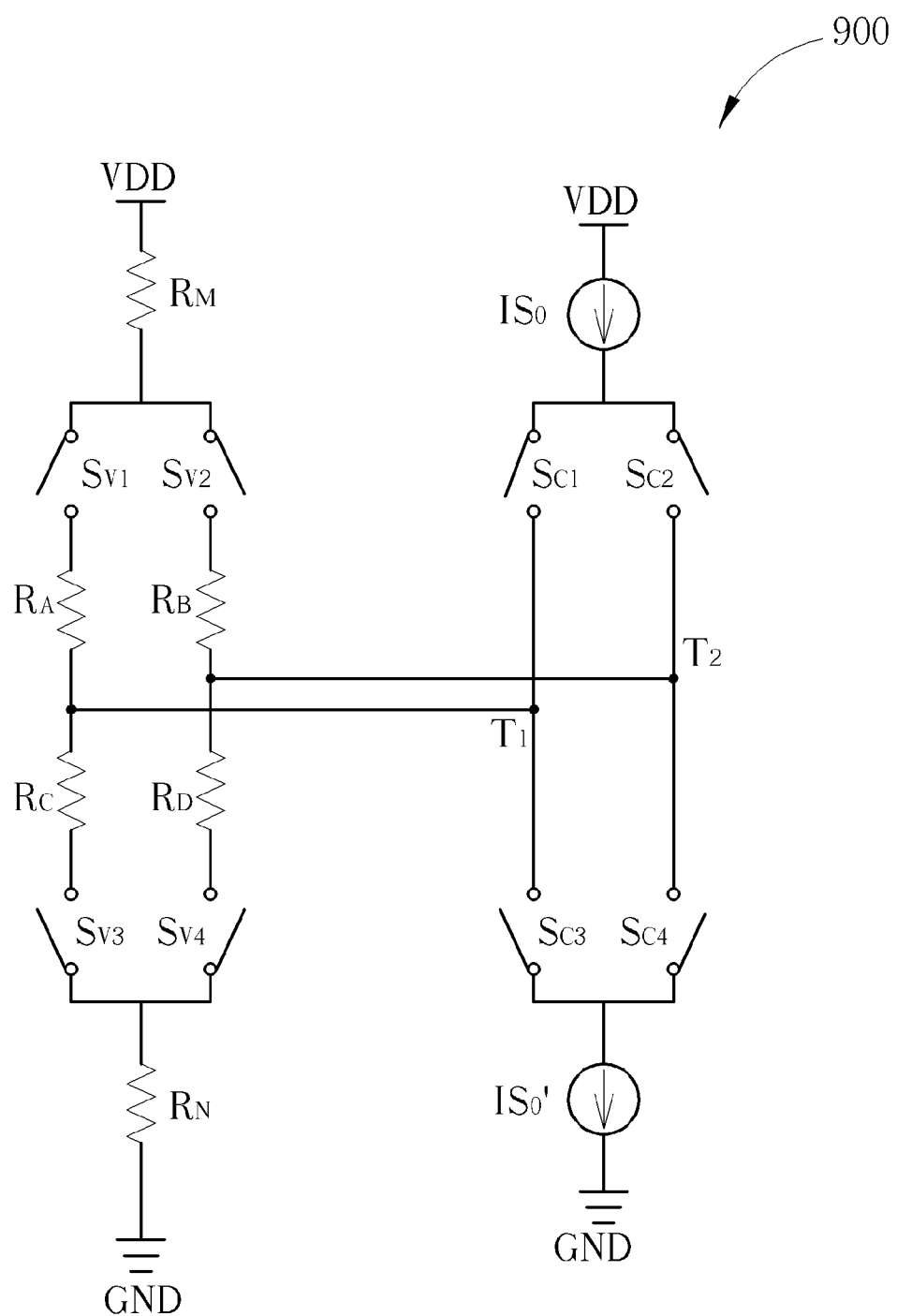
FIG. 9 is a second alternative design of the driver circuit shown in FIG. 5.
Figure 10:
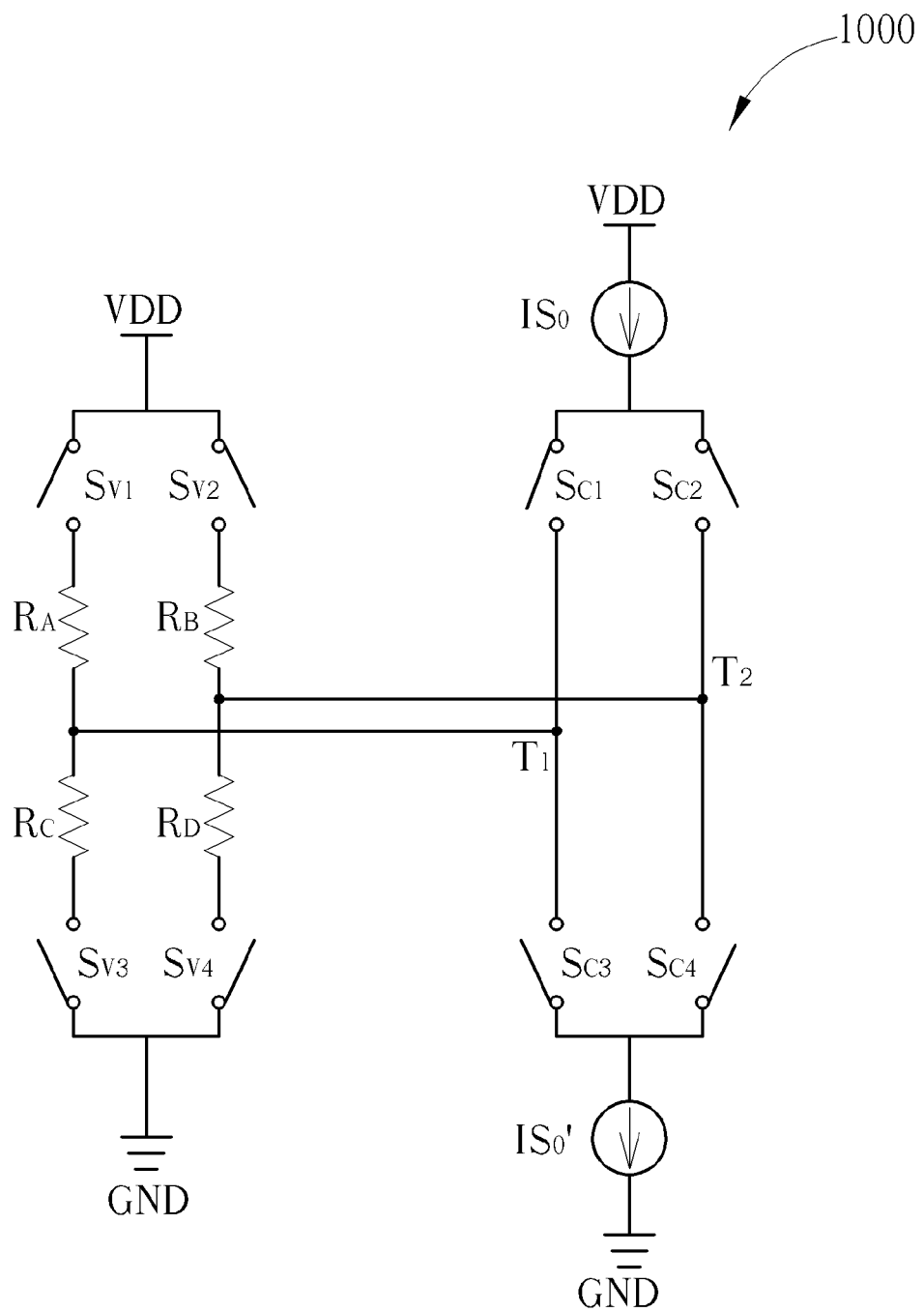
FIG. 10 is a third alternative design of the driver circuit shown in FIG. 5.
Figure 11:
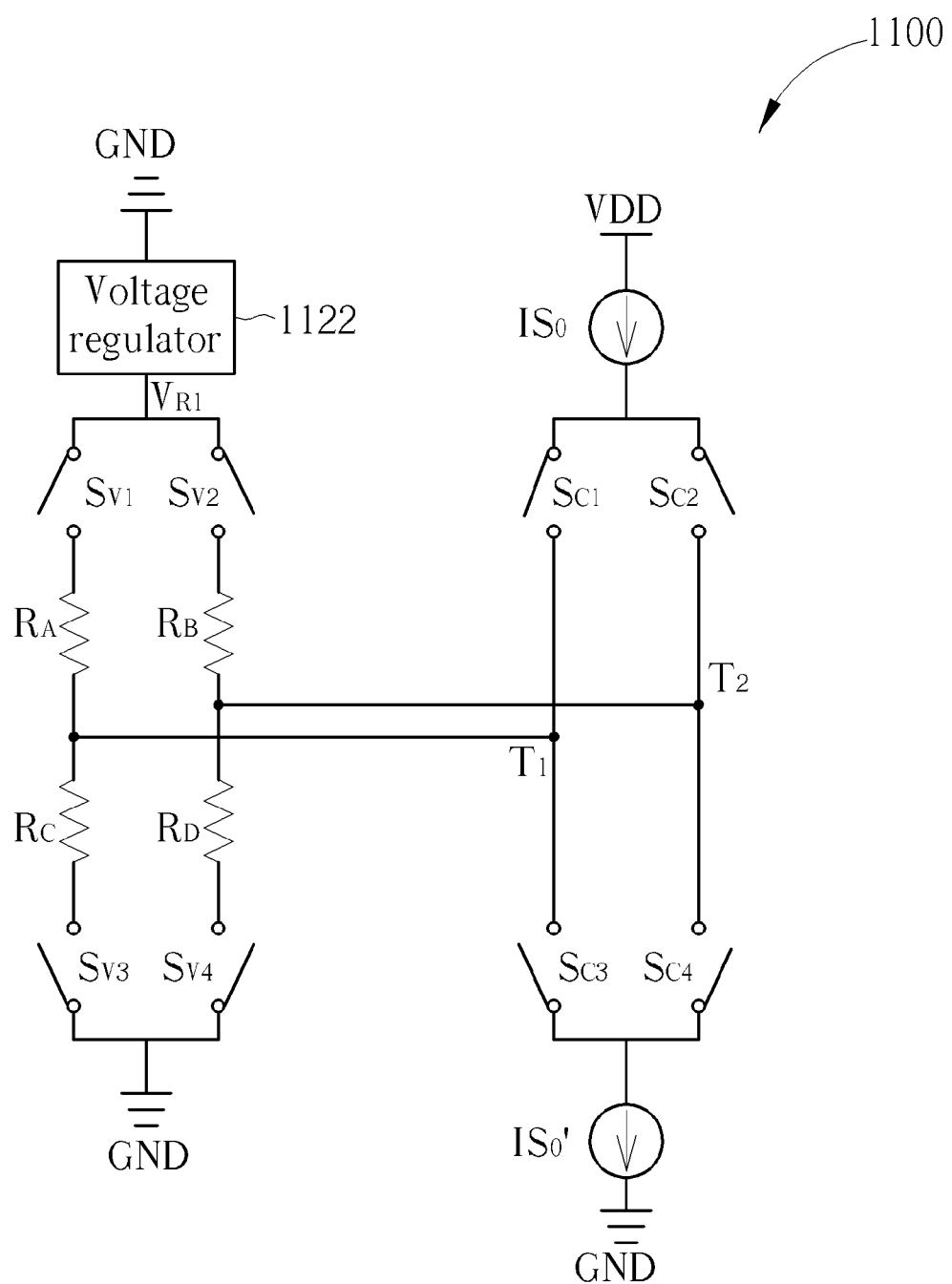
FIG. 11 is a fourth alternative design of the driver circuit shown in FIG. 5.

Please note that the voltage source $VS_0$ and/or the voltage source $VS_0'$ shown in FIG. 5 may be implemented by other voltage generation architectures. For example, as mentioned above, at least one the reference voltage $V_{R1}$ and the reference voltage $V_{R2}$ may be generated by a voltage generation circuit within the proposed driver circuit. In another example, at least one the reference voltage $V_{R1}$ and the reference voltage $V_{R2}$ may be generated by a voltage generation circuit externally coupled to the proposed driver circuit. Please refer to FIGS. 8-12. FIG. 8 is a first alternative design of the driver circuit 500 shown in FIG. 5, wherein the driver circuit 800 employs a voltage regulator 822 and a voltage regulator 824 to generate the reference voltage $V_{R1}$ and the reference voltage $V_{R2}$, respectively. FIG. 9 is a second alternative design of the driver circuit 500 shown in FIG. 5, wherein the driver circuit 900 employs a resistor $R_M$ and a resistor $R_N$ to replace the voltage source $VS_0$ and the voltage source $VS_0'$, respectively. The resistor $R_M$ is coupled to the DC power VDD. Hence, the driver circuit 900 uses the DC power VDD and a ground voltage as the reference voltage $V_{R1}$ and the reference voltage $V_{R2}$, respectively. FIG. 10 is a third alternative design of the driver circuit 500 shown in FIG. 5, wherein the driver circuit 1000 may directly couple the switches $S_{V1}$ and $S_{V2}$ to the DC power VDD, and directly couple the switches $S_{V3}$ and $S_{V4}$ to the reference voltage node GND. Specifically, the driver circuit 1000 may couple an external voltage source/terminal to an output terminal to thereby provide a corresponding reference voltage (e.g. the DC power VDD or the ground voltage). FIG. 11 is a fourth alternative design of the driver circuit 500 shown in FIG. 5, wherein the driver circuit 1100 employs a voltage regulator 1122 to replace the voltage source $VS_0$ shown in FIG. 5, and directly couple the switches $S_{V3}$ and $S_{V4}$ to the reference voltage node GND. Specifically, the driver circuit 1100 employs the voltage regulator 1122 to generate the reference voltage $V_{R1}$, and uses a ground voltage as the reference voltage $V_{R2}$ shown in FIG. 5.

Figure 12:
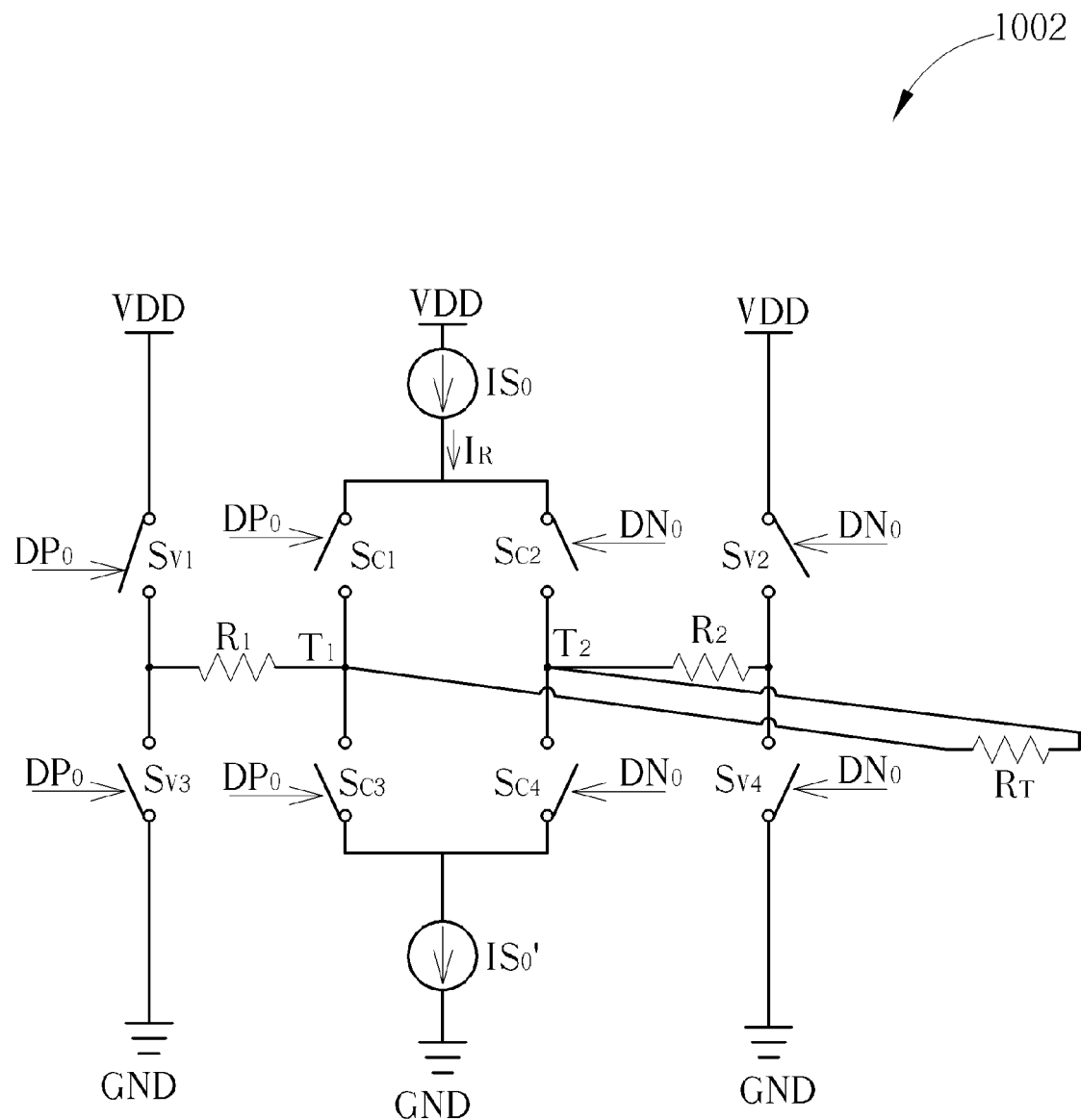
FIG. 12 is a fifth alternative design of the driver circuit shown in FIG. 5.

Additionally, the voltage source $VS_A/VS_B$ used for providing the reference voltage $V_{R1}$ shown in FIG. 2 may be implemented by other voltage generation architectures (e.g. the voltage generation architectures shown in FIGS. 8-11), and/or the voltage source $VS_C/VS_D$ used for providing the reference voltage $V_{R2}$ shown in FIG. 2 may be implemented by other voltage generation architectures (e.g. the voltage generation architectures shown in FIGS. 8-11). For example, as shown in FIG. 12, the driver circuit 1002 may directly couple the switches $S_{V1}$ and $S_{V2}$ to the DC power VDD to provide a reference voltage, and directly couple the switches $S_{V3}$ and $S_{V4}$ to the reference voltage node GND to provide another reference voltage. As a person skilled in the art should understand the operations of the driver circuit 800/900/1000/1100/1200 after reading above paragraphs directed to FIGS. 1-7, similar description is not repeated here for brevity.

Moreover, the aforementioned voltages supplied to the current mode drive unit and the voltage mode drive unit are not meant to be limitations of the present invention. In an alternative design, it is possible to use a supply voltage different from the DC power VDD for the current mode drive unit and/or the voltage mode drive unit. In another alternative design, a voltage supplied to the current mode drive unit may be different from a voltage supplied to the voltage mode drive unit.

In view of above, the proposed voltage mode drive unit may switch the output terminals $T_1$ and $T_2$ (or two terminals of the termination resistor $R_T$) to corresponding voltage sources according to a data logic to be outputted, respectively, and the proposed current mode drive unit may selectively output the reference current to the output terminal $T_1/T_2$ (or one terminal of the termination resistor $R_T$) according to the data logic to be outputted, thus avoiding/reducing unnecessary power consumption. In addition to avoiding/reducing power consumption, the proposed driver control scheme may increase an output swing of a driver circuit. Further, the proposed driver control scheme described above may be employed in not only a differential driver structure but also a single-ended driver structure. Further description is provided below.

Figure 13:
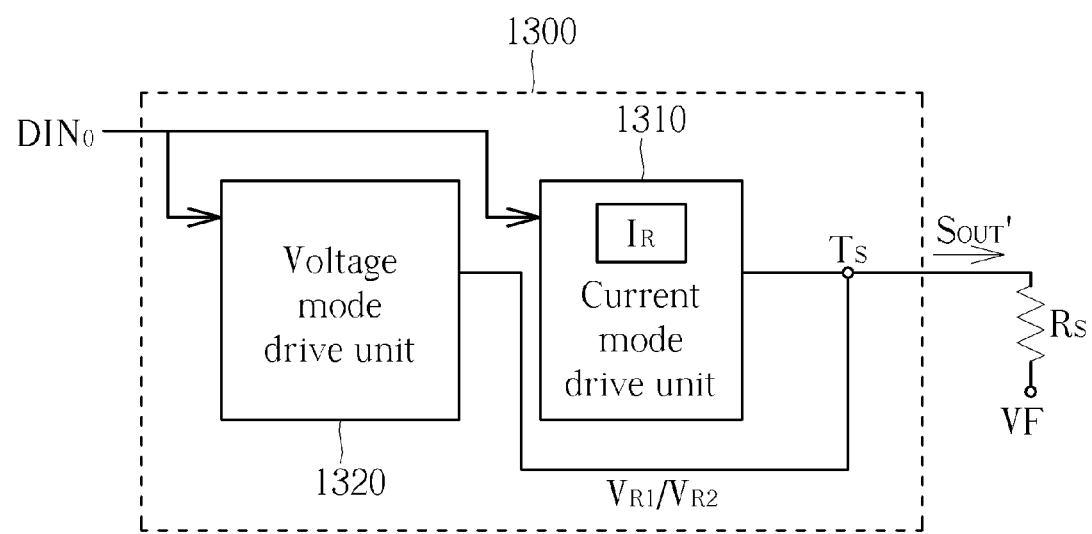
FIG. 13 is a block diagram illustrating an exemplary driver circuit according to an embodiment of the present invention.

Please refer to FIG. 13, which is a block diagram illustrating an exemplary driver circuit according to another embodiment of the present invention. The architecture of the driver circuit 1300 is based on the architecture of the driver 100 shown in FIG. 1, wherein the main difference is that the driver circuit 1300 employs a single-ended structure. In this embodiment, the driver circuit 1300 may receive the data input $DIN_0$ and generate an output signal $S_{OUT}'$ to a termination element (implemented by a termination resistor $R_S$ in this embodiment) according to the data input $DIN_0$. By way of example but not limitation, the driver circuit 1300 may be employed in a transmitter (not shown in FIG. 13), and the termination resistor $R_S$ (or a load resistor) may be located in a receiver (not shown in FIG. 13) and coupled to a reference voltage VF. The driver circuit 1300 may include an output terminals $T_S$, a current mode drive unit 1310 and a voltage mode drive unit 1320. The output signal $S_{OUT}'$ may be regarded as a voltage at the output terminal $T_S$, and correspond to an output data logic (e.g. a logic "1" corresponding to a high voltage or a logic "0" corresponding to a low voltage).

The voltage mode drive unit 1320 is coupled to the output terminal $T_S$, and is arranged for coupling one of the reference voltage $V_{R1}$ and the reference voltage $V_{R2}$ (different from the reference voltage $V_{R1}$) to the output terminal $T_S$ according to the data input $DIN_0$. Specifically, one of the reference voltage $V_{R1}$ and the reference voltage $V_{R2}$ may be provided for the output terminal $T_S$, so that the output terminal $T_S$ may have different electric potentials to provide corresponding output data logics required by the receiver.

The current mode drive unit 1310 is coupled to the output terminal $T_S$, and is arranged for generating the reference current $I_R$, wherein the current mode drive unit 1310 may selectively output the reference current $I_R$ from the output terminal $T_S$ to the termination resistor $R_S$ according to the data input $DIN_0$. Specifically, when the current mode drive unit 1310 outputs the reference current $I_R$, the current mode drive unit 1310 may steer the reference current $I_R$ to flow into the termination resistor $R_S$ such that the reference current $I_R$ outputted from the current mode drive unit 1310 flows through the termination resistor $R_S$ and is used as at least a portion of a current flowing through the termination resistor $R_S$.

Please note that, in a conventional transmitter design of non-return-to-zero (NRZ) or multi-level (e.g. PAM-4) applications, a maximum single-ended output level is limited to one half a supply voltage level. By utilizing the current mode drive unit 1310 capable of selectively outputting the reference current $I_R$, the driver circuit 1300 may increase an electric potential of the output terminal $T_S$ (e.g. greater than one half a supply voltage level), thereby increasing an output swing while maintaining a low supply voltage level.

In addition, the current mode drive unit 1310 may selectively receive the reference current $I_R$ through the output terminal $T_S$ according to the data input $DIN_0$. For example, in a case where the reference voltage $V_{R1}$ is greater than the reference voltage $V_{R2}$, when the voltage mode drive unit 1320 couples the reference voltage $V_{R1}$ to the output terminal $T_S$ according to the data input $DIN_0$, the current mode drive unit 1310 may output the reference current $I_R$ from the output terminal $T_S$ according to the data input $DIN_0$. Hence, a voltage of the output terminal $T_S$ is increased due to the reference current $I_R$ flowing through the termination resistor $R_S$. The output signal $S_{OUT}'$ may correspond to a specific output data logic (e.g. a logic "1"). Additionally, when the voltage mode drive unit 1320 couples the reference voltage $V_{R2}$ to the output terminal $T_S$ according to the data input $DIN_0$, the current mode drive unit 1310 may receive the reference current $I_R$ through the output terminal $T_S$ according to the data input $DIN_0$. The voltage of the output terminal $T_S$ may be decreased due to the reference current $I_R$ flowing into the current mode drive unit 1310. The output signal $S_{OUT}'$ may correspond to another specific output data logic (e.g. a logic "0"). Since a voltage level corresponding to the specific output data logic is increased (and/or decreased) due to a voltage drop across the termination resistor $R_S$, a high output swing can be obtained without the need for a high supply voltage.

Additionally, as the voltage mode drive unit 1320 may couple one of the reference voltage $V_{R1}$ and the reference voltage $V_{R2}$ according to the data input $DIN_0$, and the current mode drive unit 1310 may selectively output/receive the reference current $I_R$ from the output terminal $T_S$ according to the data input $DIN_0$, one skilled in the art should understand the driver control mechanism employed in the driver circuit 100 shown in FIG. 1 may be applied to the driver circuit 1300, wherein the driver circuit 100 may be regarded as, but is not limited to, a driver circuit employing bridge termination, and the driver circuit 1300 may be regarded as, but is not limited to, a driver circuit employing single-ended termination. Hence, the control mechanism described in above paragraphs directed to FIGS. 1-12 may be applied to a proposed driver circuit having a single-ended structure.

Figure 14:
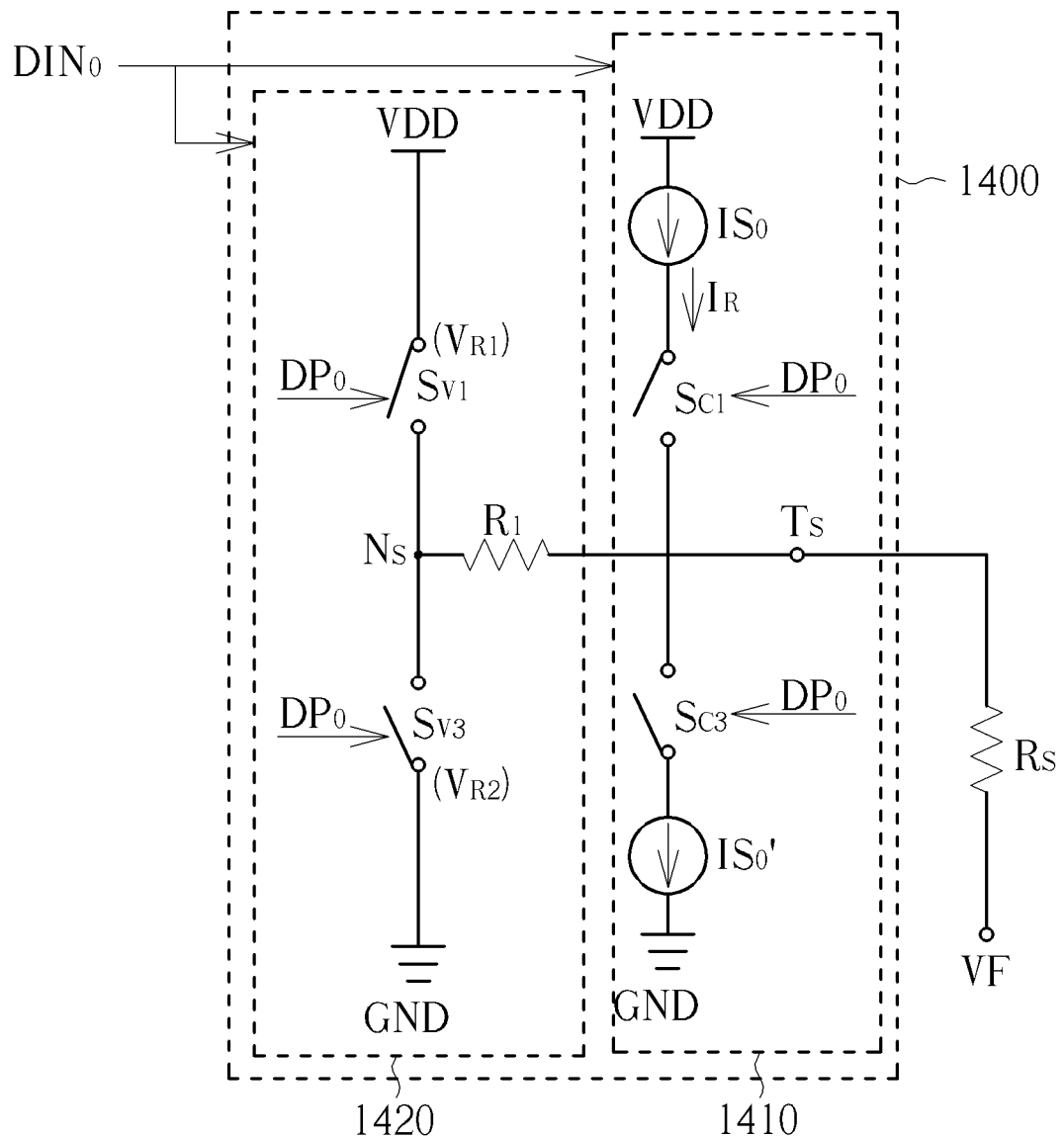
FIG. 14 is a diagram illustrating an implementation of the driver circuit shown in FIG. 13.

FIG. 14 is a diagram illustrating an implementation of the driver circuit 1300 shown in FIG. 13. In this implementation, the driver circuit 1400 may include the output terminal $T_S$ shown in FIG. 13, a current mode drive unit 1410 and a voltage mode drive unit 1420, wherein the current mode drive unit 1310 and the voltage mode drive unit 1320 shown in FIG. 13 may be implemented by the current mode drive unit 1410 and the voltage mode drive unit 1420, respectively. Additionally, the symbol VDD denotes a direct current (DC) power required by circuit elements, and the symbol GND denotes a reference voltage node (e.g. a common ground).

The current mode drive unit 1410 may include the current source $IS_0$ and the current sink $IS_0'$ shown in FIG. 2. The current source $IS_0$ may be arranged for generating the reference current $I_R$, and is selectively coupled to the output terminal $T_S$ according to the data input $DIN_0$. The current sink $IS_0'$ may be arranged for receiving the reference current $I_R$, and is selectively coupled to the output terminal $T_S$ according to the data input $DIN_0$, wherein when one of the current source $IS_0$ and the current sink $IS_0'$ is coupled to the output terminal $T_S$ according to the data input $DIN_0$, the other of the current source $IS_0$ and the current sink $IS_0'$ is not coupled to the output terminal $T_S$.

In this implementation, the current mode drive unit 1410 may include further include the switches $S_{C1}$ and $S_{C3}$, wherein switch states of the switches $S_{C1}$ and $S_{C3}$ are controlled by the data signal $DP_0$ of the data input $DIN_0$. The switch $S_{C1}$ is selectively coupled between the current source $IS_0$ and the output terminal $T_S$ according to the data signal $DP_0$, and the switch $S_{C3}$ is selectively coupled between the current sink $IS_0'$ and the output terminal $T_S$ according to the data signal $DP_0$, wherein when the switch $S_{C1}$ is switched on due to the data signal $DP_0$, the switch $S_{C3}$ is switched off; and when the switch $S_{C1}$ is switched off due to the data signal $DP_0$, the switch $S_{C3}$ is switched on. Specifically, the switching operations of the switches $S_{C1}$ and $S_{C3}$ in this embodiment are identical/similar to those of the switches $S_{C1}$ and $S_{C3}$ shown in FIG. 2.

The voltage mode drive unit 1420 may include the impedance element (implemented by the resistor $R_1$) and the switches $S_{V1}$ and $S_{V3}$ shown in FIG. 2. The resistor $R_1$ is coupled between a node $N_S$ and the output terminal $T_S$, wherein the node $N_S$ may be coupled to the DC power VDD (i.e. the reference voltage $V_{R1}$) through the switch $S_{V1}$ or coupled to a ground voltage (i.e. the reference voltage $V_{R2}$) through the switch $S_{V3}$ according to the data input $DIN_0$. To put it differently, the switch $S_{V1}$ is selectively coupled between the reference voltage $V_{R1}$ and the output terminal $T_S$ (through the resistor $R_1$) according to the data input $DIN_0$, and the switch $S_{V3}$ is selectively coupled between the reference voltage $V_{R2}$ and the output terminal $T_S$ (through the resistor $R_1$) according to the data input $DIN_0$.

In this implementation, when the switch $S_{V1}$ is switched on due to the data input $DIN_0$, the switch $S_{V3}$ is switched off; when the switch $S_{V1}$ is switched off due to the data input $DIN_0$, the switch $S_{V3}$ is switched on. For example, the data signal $DP_0$ of the data input $DIN_0$ may control switch states of the switches $S_{V1}$ and $S_{V3}$, wherein when one of the switches $S_{V1}$ and $S_{V3}$ is switched on, the other of the switches $S_{V1}$ and $S_{V3}$ is switched off. Based on the aforementioned switch operations, one terminal of the resistor $R_1$ is coupled to output terminal $T_S$, and another terminal of the resistor $R_1$ (the node $N_S$) may be coupled to the DC power VDD through the switch $S_{V1}$ or coupled to the ground voltage through the switch $S_{V3}$ according to the data input $DIN_0$.

For example, in a case where the reference voltage $V_{R1}$ is greater than the reference voltage $V_{R2}$, when the switch $S_{V1}$ is switched on according to the data signal $DP_0$ such that the reference voltage $V_{R1}$ (the DC power VDD) is coupled to the output terminal $T_S$ through the resistor $R_1$, the switch $S_{C1}$ is switched on, and the switches $S_{V3}$ and $S_{C3}$ are switched off. Hence, the reference current $I_R$ generated from the current source $IS_0$ may be outputted from the output terminal $T_S$ to the termination resistor $R_S$ through the switch $S_{C1}$, thus increasing a voltage of the output terminal $T_S$. Additionally, when the switch $S_{V1}$ is switched off and the switch $S_{V3}$ is switched on, the switch $S_{C1}$ is switched off and the switch $S_{C3}$ is switched on such that the current sink $IS_0'$ receives the reference current $I_R$. Based on the above switching operations, a high output swing can be obtained without the use of a high supply voltage.

The aforementioned architecture and switch control signal of the voltage mode drive unit 1420 are for illustrative purposes, and are not meant to be limitations of the present invention. In one alternative design, the switches $S_{V1}$ and $S_{V3}$ may be replaced by a three-way switch, thus allowing the node $N_S$ to be coupled to one of the DC power VDD and the ground voltage according to the data input $DIN_0$.

In another alternative design, the switches $S_{V1}$ and $S_{V3}$ and the resistor $R_1$ shown in FIG. 14 may be replaced by the switches $S_{V1}$ and $S_{V3}$ and the resistors $R_A$ and $R_C$ shown in FIG. 5. In other words, the structure of the voltage mode drive unit 1420 may be modified by the voltage mode drive unit 520 shown in FIG. 5 in this alternative design. Hence, one terminal of the resistor $R_A$ is coupled to an output terminal (i.e. the output terminal $T_S$), and another terminal of the resistor $R_A$ is selectively coupled to the DC power VDD through the switch $S_{V1}$ according to the data input $DIN_0$; one terminal of the resistor $R_B$ is coupled to the output terminal (i.e. the output terminal $T_S$), and another terminal of the resistor $R_B$ is selectively coupled to the ground voltage through the switch $S_{V1}$ according to the data input $DIN_0$. As one skilled in the art can understand that the operation of the voltage mode drive unit 1420 modified by the voltage mode drive unit 520 shown in FIG. 5, further description is omitted here for brevity.

In yet another alternative design, the switches $S_{V1}$ and $S_{V3}$ and the resistor $R_1$ shown in FIG. 14 may be replaced by the resistors $R_A$ and $R_C$ shown in FIG. 5 and a three-way switch (not shown in FIG. 14). Hence, when the DC power VDD is coupled to the output terminal $T_S$ through the resistor $R_A$ according to the data input $DIN_0$, the ground voltage is not coupled to the output terminal $T_S$; when the ground voltage is coupled to the output terminal $T_S$ through the resistor $R_B$ according to the data input $DIN_0$, the DC power VDD is not coupled to the output terminal $T_S$.

In still another alternative design, the switches $S_{C1}$ and $S_{C3}$ may be replaced by a three-way switch, thus allowing the output terminal $T_S$ to be coupled to one of the current source $IS_0$ and the current sink $IS_0'$ according to the data input $DIN_0$.

In brief, as long as the node $N_S$ may be coupled to one of the DC power VDD and the ground voltage according to the data input $DIN_0$, and one of the current source $IS_0$ and the current sink $IS_0'$ may be coupled to the output terminal $T_S$ according to the data input $DIN_0$, such alternatives and modifications fall within the scope of the present invention.

In one embodiment, the proposed driver circuit may further use coupling techniques to adjust a voltage level at an output terminal. Please refer to FIG. 15, which is a block diagram illustrating an exemplary driver circuit according to another embodiment of the present invention. The architecture of the driver circuit 1500 is based on the architecture of the driver 1300 shown in FIG. 13, wherein the main difference is that the driver circuit 1500 utilizes a capacitive element 1506 (implemented by a capacitor $C_S$ in this embodiment) to adjust a voltage level at the output terminal $T_S$. For example, when the termination resistor $R_S$ is coupled to a ground terminal (the reference voltage VF is implemented by a ground voltage), coupling the capacitor $C_S$ between the output terminal $T_S$ and the termination resistor $R_S$ may prevent the voltage level at the output terminal $T_S$ from falling below zero volts.

Figure 15:
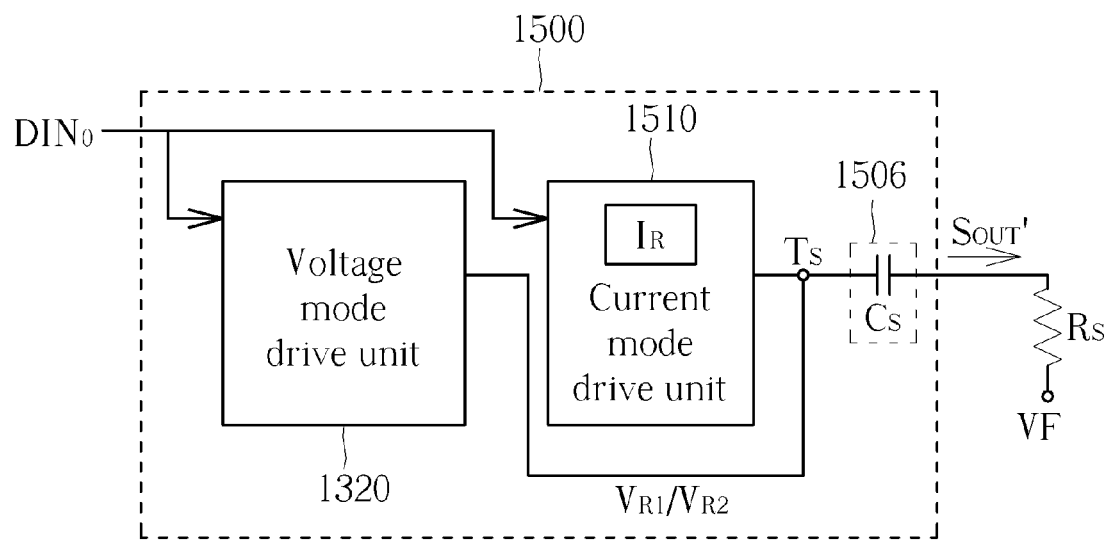
FIG. 15 is a block diagram illustrating an exemplary driver circuit according to an embodiment of the present invention.
Figure 16:
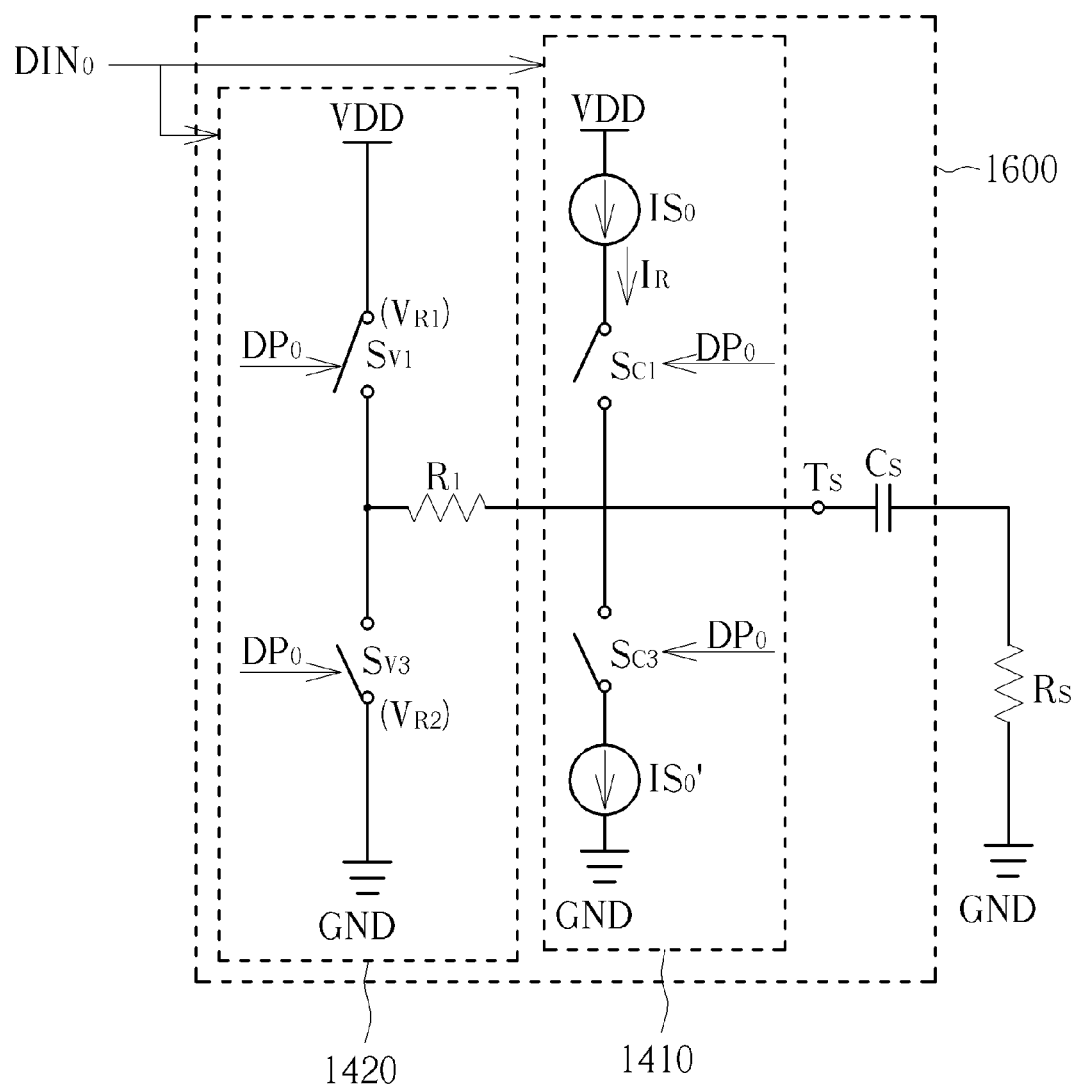
FIG. 16 is a diagram illustrating an implementation of the driver circuit shown in FIG. 15.

FIG. 16 is a diagram illustrating an implementation of the driver circuit 1500 shown in FIG. 15. The architecture of the driver circuit 1600 is based on the architecture of the driver 1400 shown in FIG. 14, wherein the main difference is that the driver circuit 1600 uses the capacitor $C_S$ for AC coupling. In this implementation, the termination resistor $R_S$ is coupled to the common ground GND for illustrative purposes. One skilled in the art should understand that this is not meant to be a limitation of the present invention. By way of example but not limitation, assuming that a magnitude of the DC power VDD is 1 V, a magnitude of the reference current $I_R$ is 1 mA, and each of an impedance value of the resistor $R_1$ and an impedance value of the termination resistor $R_S$ equals to 50 ohm (impedance matching), a maximum voltage level at the output terminal $T_S$ may be increased to 775 mV (i.e. $VDD/2+VDD/4+I_R \times R_S/2$), and a minimum voltage level at the output terminal $T_S$ may be 225 mV (i.e. $VDD/2-VDD/4-I_R \times R_S/2$). The output voltage swing of the output terminal $T_S$ may be represented by $(VDD/2+I_R \times R_S)$. As a person skilled in the coupling techniques should understand the operations of the driver circuit 1500/1600 after reading the paragraphs directed to FIGS. 1-14, further description is omitted here for brevity.

A driver circuit having a differential pair of output terminals may utilize the proposed driver control mechanism to increase the output swing. Please refer to FIG. 12 again. In a case where the DC power VDD (one reference voltage) is greater than the ground voltage (another reference voltage), when the switches $S_{V1}$ and $S_{C1}$ are switched on according to the data signal $DP_0$, the switches $S_{V4}$ and $S_{C4}$ are switched on according to the data signal $DN_0$, the switches $S_{V3}$ and $S_{C3}$ are switched off according to the data signal $DP_0$ and the switches $S_{V2}$ and $S_{C2}$ are switched off according to the data signal $DN_0$. Additionally, when the switches $S_{V1}$ and $S_{C1}$ are switched off according to the data signal $DP_0$, the switches $S_{V4}$ and $S_{C4}$ are switched off according to the data signal $DN_0$, the switches $S_{V3}$ and $S_{C3}$ are switched on according to the data signal $DP_0$ and the switches $S_{V2}$ and $S_{C2}$ are switched on according to the data signal $DN_0$. By way of example but not limitation, assuming that a magnitude of the DC power VDD is 1 V, a magnitude of the reference current $I_R$ is 1 mA, each of an impedance value of the resistors $R_1$ and $R_2$ equals to 50 ohm, and an impedance value of the termination resistor $R_T$ equals to 100 ohm (impedance matching), a maximum voltage level at the output terminal $T_S$ may be increased to 550 mV (i.e. $VDD/2+I_R \times R_T/2$), and a minimum voltage level at the output terminal $T_S$ may be −550 mV (i.e. $-VDD/2-I_R \times R_S/2$). The output voltage swing of the output terminal $T_S$ may be represented by $(VDD+I_R \times R_S)$.

In view of the above, compared to a conventional transmitter design having a maximum differential output level (a peak-to-peak level) limited to a supply voltage level, the proposed driver circuit may obtain an output swing higher than the supply voltage level (i.e. VDD).

In one embodiment, the proposed driver control mechanism may be employed in other differential circuit topologies, such as the driver circuit 500 shown in FIG. 5, to increase an output swing. As a person skilled in the art should understand the operations of a differential driver circuit utilizing the proposed driver control mechanism after reading above paragraphs directed to FIGS. 1-16, further description is omitted here for brevity.

Figure 17:
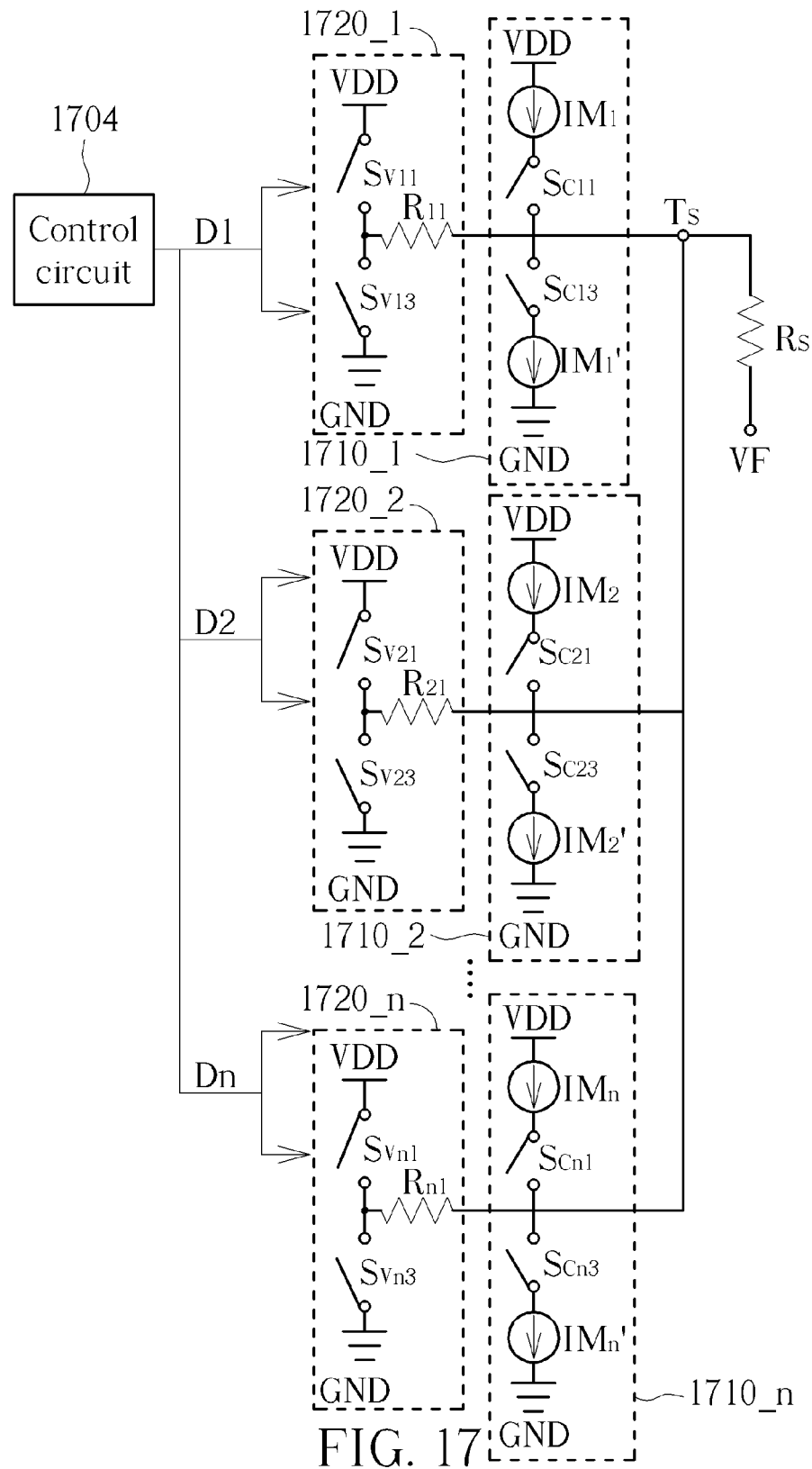
FIG. 17 is a diagram illustrating an exemplary driver circuit according to an embodiment of the present invention.

The proposed driver control mechanism may be employed in a multi-level driver. Please refer to FIG. 17, which is a diagram illustrating an exemplary driver circuit according to an embodiment of the present invention. The architecture of the driver circuit shown in FIG. 17 is based on that of the driver circuit 1400 shown in FIG. 14, and the main difference is that the driver circuit shown in FIG. 17 includes n current mode drive units 1710_1-1710_n and n voltage mode drive units 1720_1-1720_n, wherein n is an integer greater than one. The driver circuit shown in FIG. 17 generates an output signal to the termination resistor $R_S$ according to n data inputs (having data signals D1-Dn respectively) generated from a control circuit 1704, which may be implemented by a digital-to-analog converter (DAC), a transmit finite impulse response (FIR) circuit or other types of control circuit. In this embodiment, the current mode drive unit 1710_1 and the voltage mode drive unit 1720_1 are controlled by the data signal D1, the current mode drive unit 1710_2 and the voltage mode drive unit 1720_2 are controlled by the data signal D2, and so on.

Each current mode drive unit includes a current source (one of current sources $IM_1$-$IM_n$), a current sink (one of current sinks $IM_1'$-$IM_n'$) and a set of switches (e.g. switches $S_{C11}$-$S_{C13}/S_{C21}$-$S_{C23}/\ldots/S_{Cn1}$-$S_{Cn3}$), and may output a reference current from the output terminal $T_S$ to the termination resistor $R_S$ according to a corresponding data input (one of the data signals D1-Dn). Each voltage mode drive unit includes a set of switches (e.g. switches $S_{V11}$-$S_{V13}/S_{V21}$-$S_{V23}/\ldots/S_{Vn1}$-$S_{Vn3}$) and an impedance element (one of resistors $R_{11}$-$R_{n1}$), and may couple one of the DC power VDD and the ground voltage to the output terminal $T_S$ according to a corresponding data input (one of the data signals D1-Dn).

In one exemplary design where the control circuit 1704 is implemented by a DAC providing a binary-weighted output code, the n data inputs (the data signals D1-Dn) correspond to a binary code of n bits, and the generated output signal (e.g. the voltage level at the output terminal $T_S$) may include n components which are generated in response to the data signals D1-Dn respectively. In other words, the n components of the generated output signal have a binary-weighted relationship.

In another exemplary design where the control circuit 1704 is implemented by a transmit FIR circuit, different voltage/current mode drive units are used for pre-emphasis and/or de-emphasis, wherein one of the data signals D1-Dn is an advanced signal or a delayed signal relative to another/others of the data signals D1-Dn. As a person skilled in the multi-level driver circuitry should understand the operations of the driver circuit shown in FIG. 17 after reading the paragraphs directed to FIGS. 1-14, further description is omitted for brevity.

Figure 18:
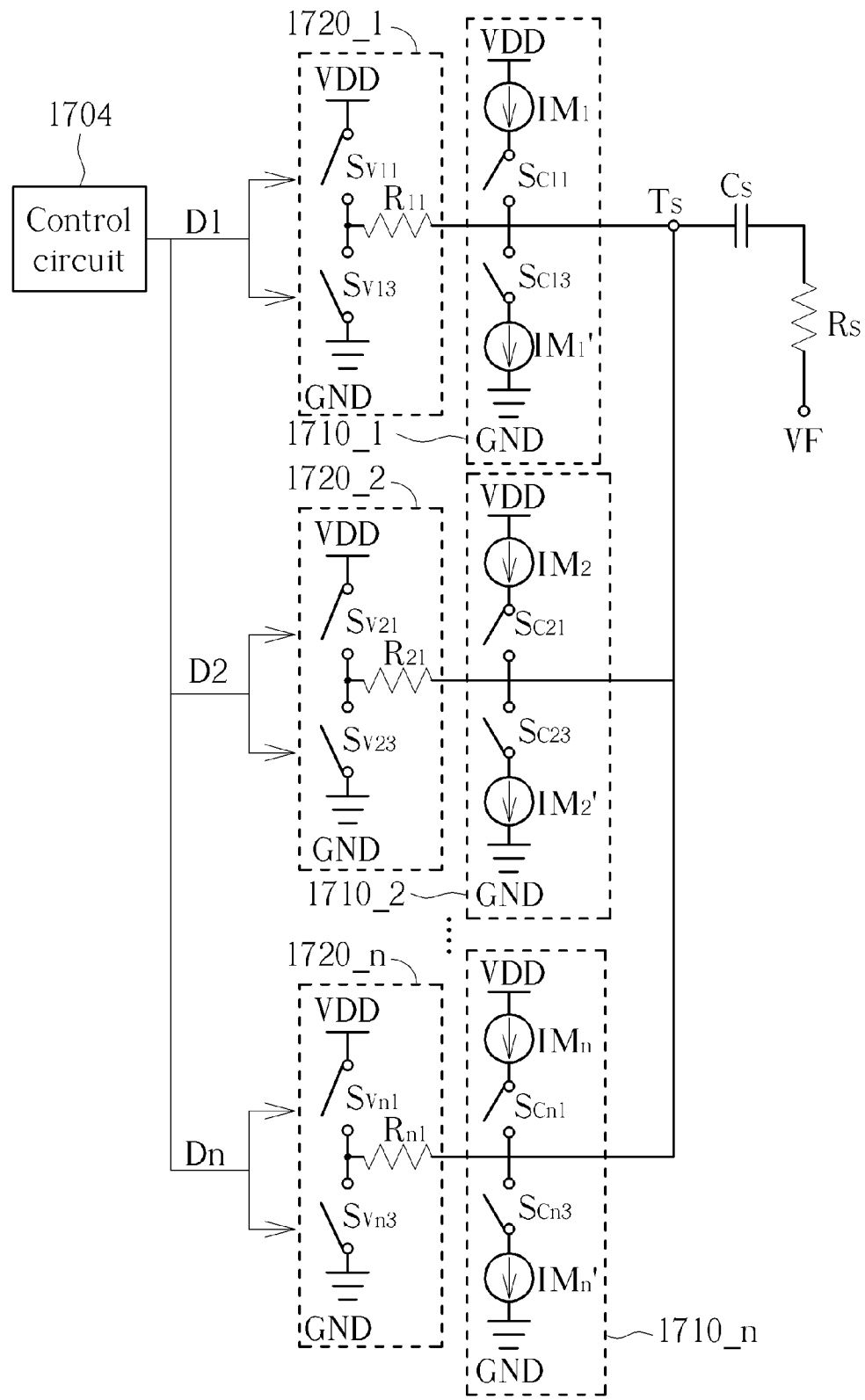
FIG. 18 is a diagram illustrating an exemplary driver circuit according to another embodiment of the present invention.

FIG. 18 is a diagram illustrating an exemplary driver circuit according to another embodiment of the present invention. The architecture of the driver circuit shown in FIG. 18 is based on that of the driver circuit shown in FIG. 17, and the main difference is that the driver circuit shown in FIG. 18 further includes the capacitor $C_S$ for AC coupling. After reading the paragraphs directed to FIGS. 1-17, a person skilled in the art should understand that the operations of the driver circuit shown in FIG. 18 employed in the multi-level driver applications. Similar description is not repeated here for brevity.

Figure 19:
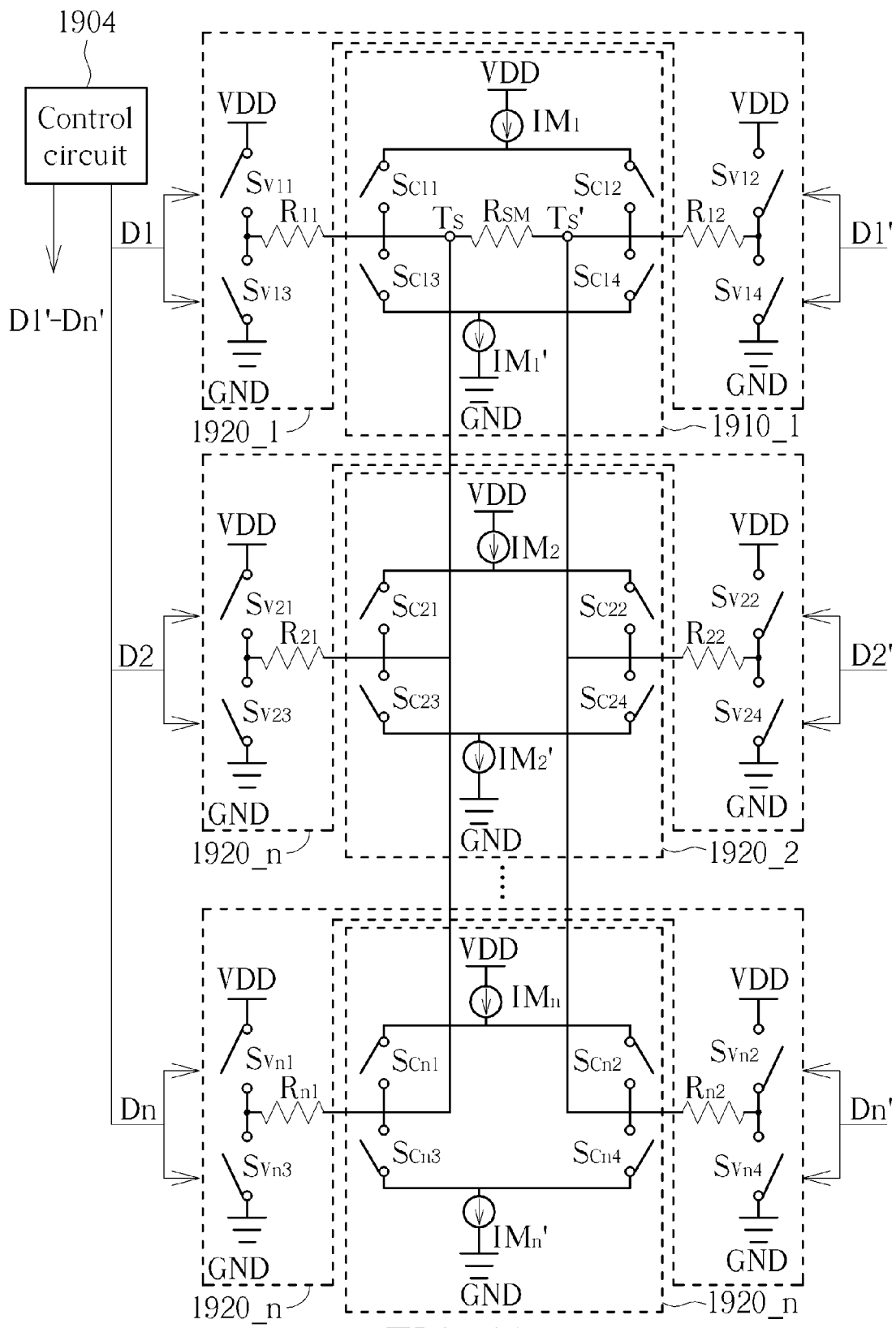
FIG. 19 is a diagram illustrating an exemplary driver circuit according to another embodiment of the present invention.

FIG. 19 is a diagram illustrating an exemplary driver circuit according to another embodiment of the present invention. The architecture of the driver circuit shown in FIG. 19 is based on that of the driver circuit 1200 shown in FIG. 12, and the main difference is that the driver circuit shown in FIG. 19 includes n current mode drive units 1910_1-1910_n and n voltage mode drive units 1920_1-1920_n, wherein n is an integer greater than one. The driver circuit shown in FIG. 19 generates an output signal to the termination resistor $R_S$ according to n data inputs generated from a control circuit 1904, which may be implemented by a digital-to-analog converter (DAC), a transmit finite impulse response (FIR) circuit or other types of control circuit. In this embodiment, each of the n data inputs includes a first data signal (one of the data signals D1-Dn) and a second data signal (one of the data signals D1'-Dn'), wherein the first data signal and the second data signal may be inverted with respect to each other, or non-overlapping signals. In addition, the current mode drive unit 1910_1 and the voltage mode drive unit 1920_1 are controlled by the data signal D1 and the data signal D1', the current mode drive unit 1910_2 and the voltage mode drive unit 1920_2 are controlled by the data signal D2 and the data signal D2', and so on.

Each current mode drive unit includes a current source (one of current sources $IM_1$-$IM_n$), a current sink (one of current sinks $IM_1'$-$IM_n'$) and a set of switches (e.g. switches $S_{C11}$-$S_{C14}$/$S_{C21}$-$S_{C24}$/ . . . /$S_{Cn1}$-$S_{Cn4}$), and may output/receive a reference current from a differential pair of output terminals (having output terminals $T_S$ and $T_S'$) according to a corresponding data input (a set of the data signals D1-D1'/D2-D2'/ . . . /Dn-Dn'). Each voltage mode drive unit includes a set of switches (e.g. switches $S_{V11}$-$S_{V14}$/$S_{V21}$-$S_{V24}$/ . . . /$S_{Vn1}$-$S_{Vn4}$) and a set of impedance elements (resistors $R_{11}$-$R_{12}$/$R_{21}$-$R_{22}$/ . . . /$R_{n1}$-$R_{n2}$), and may couple the DC power VDD to one of the output terminals $T_S$ and $T_S'$ and couple the ground voltage to the other of the output terminals $T_S$ and $T_S'$ according to a corresponding data input (a set of the data signals D1-D1'/D2-D2'/ . . . /Dn-Dn').

In one exemplary design where the control circuit 1904 is implemented by a DAC providing a binary-weighted output code, the n data inputs (i.e. the data signals D1-Dn or D1'-Dn') correspond to a binary code of n bits, and the generated output signal may include n components which are generated in response to the n data inputs respectively. In other words, the n components of the generated output signal have a binary-weighted relationship.

Consider a case where the data signals D1-Dn are generated by a 3-bit DAC (i.e. n equals to 3). By way of example but not limitation, when a magnitude of the DC power VDD is 1 V, a sum of respective magnitudes of reference currents generated from the current sources $IM_1$-$IM_3$ is 1 mA, and a sum of respective inverses of impedance values of the resistors $R_{11}$-$R_{n1}$ (i.e. $1/R_{11}+1/R_{21}+ \ldots +1/R_{n1}$) equals to an inverse of one half an impedance value of the termination resistor $R_{SM}$, a sum of respective inverses of impedance values of the resistors $R_{12}$-$R_{n2}$ (i.e. $1/R_{12}+1/R_{22}+ \ldots +1/R_{n2}$) equals to the inverse of one half the impedance value of the termination resistor $R_{SM}$, and the impedance value of the termination resistor $R_{SM}$ equals to 100 ohm, the relationship between the binary-weighted code and a differential output (a level difference between the output terminals $T_S$ and $T_S'$) is shown in the table below.

| D3/D2/D1 | Differential output |
|---|---|
| 1/1/1 | +550 mV |
| 1/1/0 | +393 mV |
| 1/0/1 | +236 mV |
| 1/0/0 | +79 mV |
| 0/1/1 | −79 mV |
| 0/1/0 | −236 mV |
| 0/0/1 | −393 mV |
| 0/0/0 | −550 mV |

In another exemplary design where the control circuit 1904 is implemented by a transmit FIR circuit, different voltage/current mode drive units are used for pre-emphasis and/or de-emphasis, wherein one of the n data inputs is an advanced signal or a delayed signal relative to another/others of the n data inputs.

Consider a case where the data signals D1-Dn are generated by a 3-tap transmit FIR circuit (i.e. n equals to 3) and a weight ratio corresponding to D1-Dn is 5:2:1. By way of example but not limitation, when a magnitude of the DC power VDD is 1 V, a sum of respective magnitudes of reference currents generated from the current sources $IM_1$-$IM_3$ is 1 mA, and a sum of respective inverses of impedance values of the resistors $R_{11}$-$R_{n1}$ (i.e. $1/R_{11}+1/R_{21}+ \ldots +1/R_{n1}$) equals to an inverse of one half an impedance value of the termination resistor $R_{SM}$, a sum of respective inverses of impedance values of the resistors $R_{12}$-$R_{n2}$ (i.e. $1/R_{12}+1/R_{22}+ \ldots +1/R_{n2}$) equals to the inverse of one half the impedance value of the termination resistor $R_{SM}$, and the impedance value of the termination resistor $R_{SM}$ equals to 100 ohm, the relationship between the binary-weighted code and a differential output (a level difference between the output terminals $T_S$ and $T_S'$) is shown in the table below.

| D3/D2/D1 | Differential output |
|---|---|
| 1/1/1 | +550 mV |
| 1/1/0 | +413 mV |
| 1/0/1 | +275 mV |

| D3/D2/D1 | Differential output |
|---|---|
| 1/0/0 | +138 mV |
| 0/1/1 | −138 mV |
| 0/1/0 | −275 mV |
| 0/0/1 | −413 mV |
| 0/0/0 | −550 mV |

As a person skilled in the multi-level driver circuitry should understand the operations of the driver circuit shown in FIG. 19 after reading the paragraphs directed to FIGS. 1-18, further description is omitted here for brevity.

Figure 20:
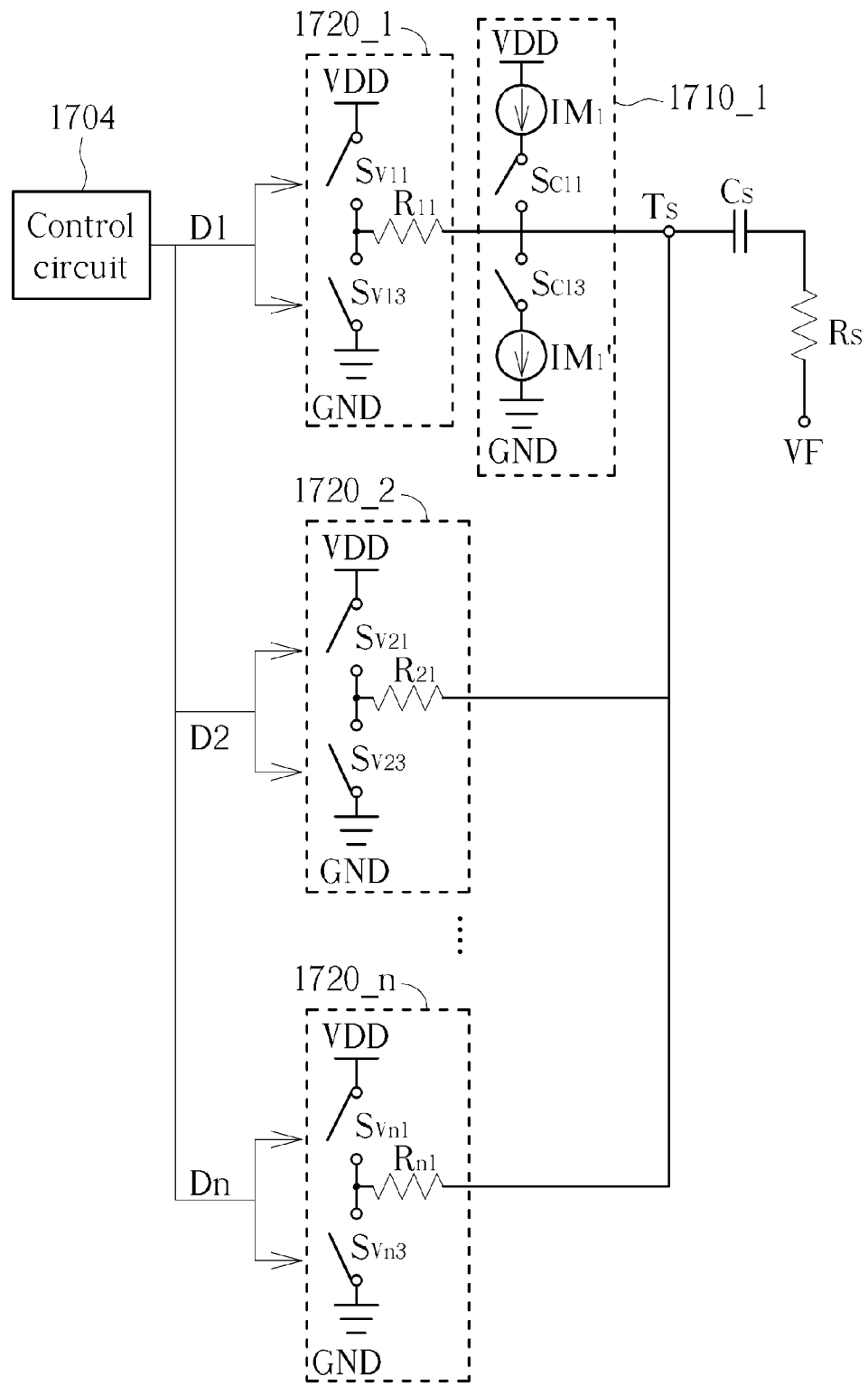
FIG. 20 is a diagram illustrating an exemplary driver circuit according to another embodiment of the present invention.
Figure 21:
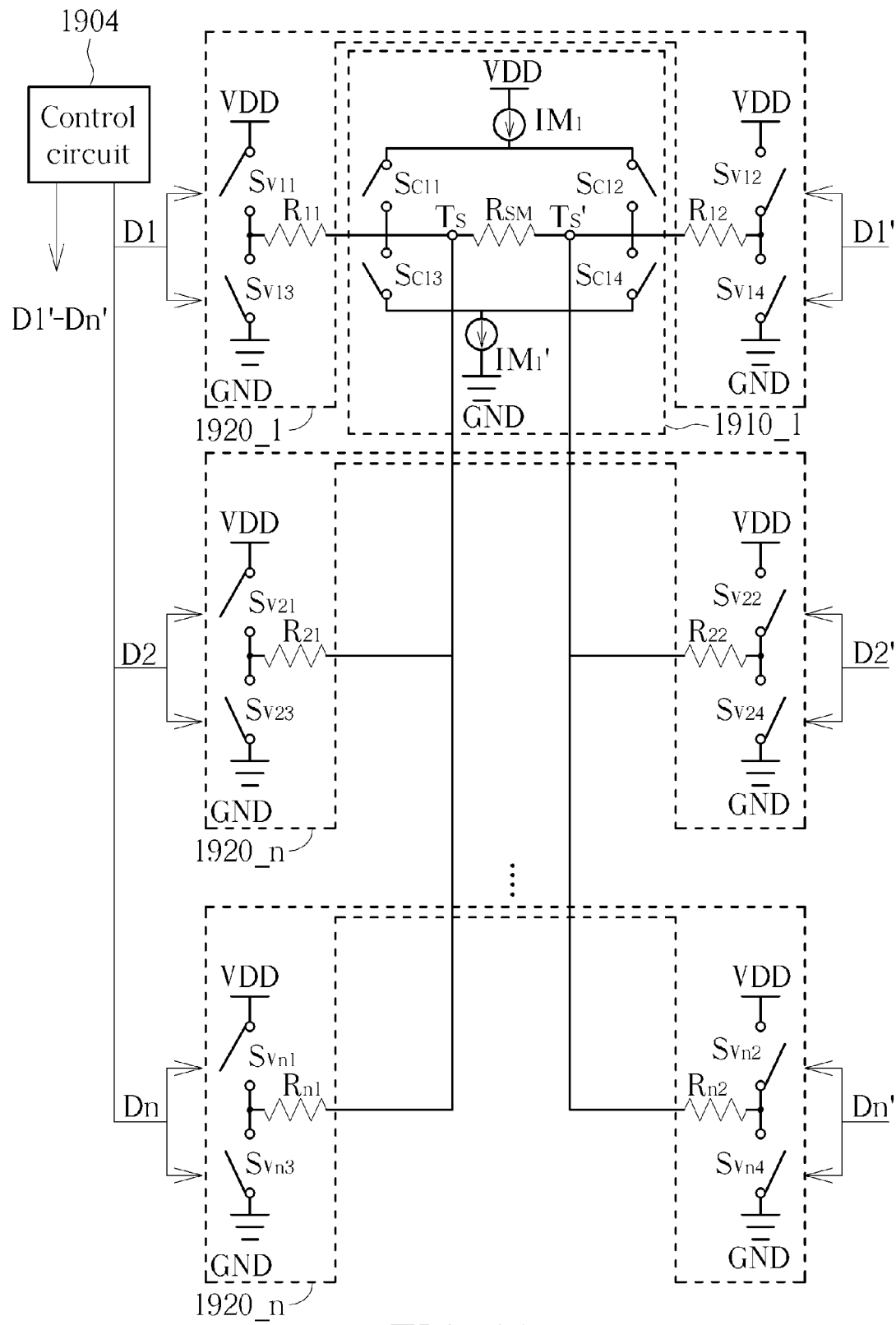
FIG. 21 is a diagram illustrating an exemplary driver circuit according to another embodiment of the present invention.

The above is for illustrative purposes only, and is not meant to be a limitation of the present invention. In an alternative design, the number of the current mode drive units and the number of the voltage mode drive units may be different. For example, high speed application may use less current mode drive units to increase bandwidth. FIG. 20 illustrates an example where the number of the current mode drive units may be less than the number of the voltage mode drive units in a single-ended driver structure, and FIG. 21 illustrates an example where the number of the current mode drive units may be less than the number of the voltage mode drive units in a differential driver structure. In another example, it is possible to utilize the proposed drive control mechanism in a driver circuit where number of the voltage mode drive units may be less than the number of the current mode drive units.

Please note that, in a case where the proposed driver circuit is employed in an equalizer architecture in order to improve quality of signal transmission, the proposed current mode drive unit may be utilized to increase design flexibility. An exemplary implementation of a three-tap finite impulse response (FIR) equalizer is given in the following for description of the proposed equalizer architecture. However, a person skilled in the art should understand that this is not meant to be a limitation of the present invention.

Figure 22:
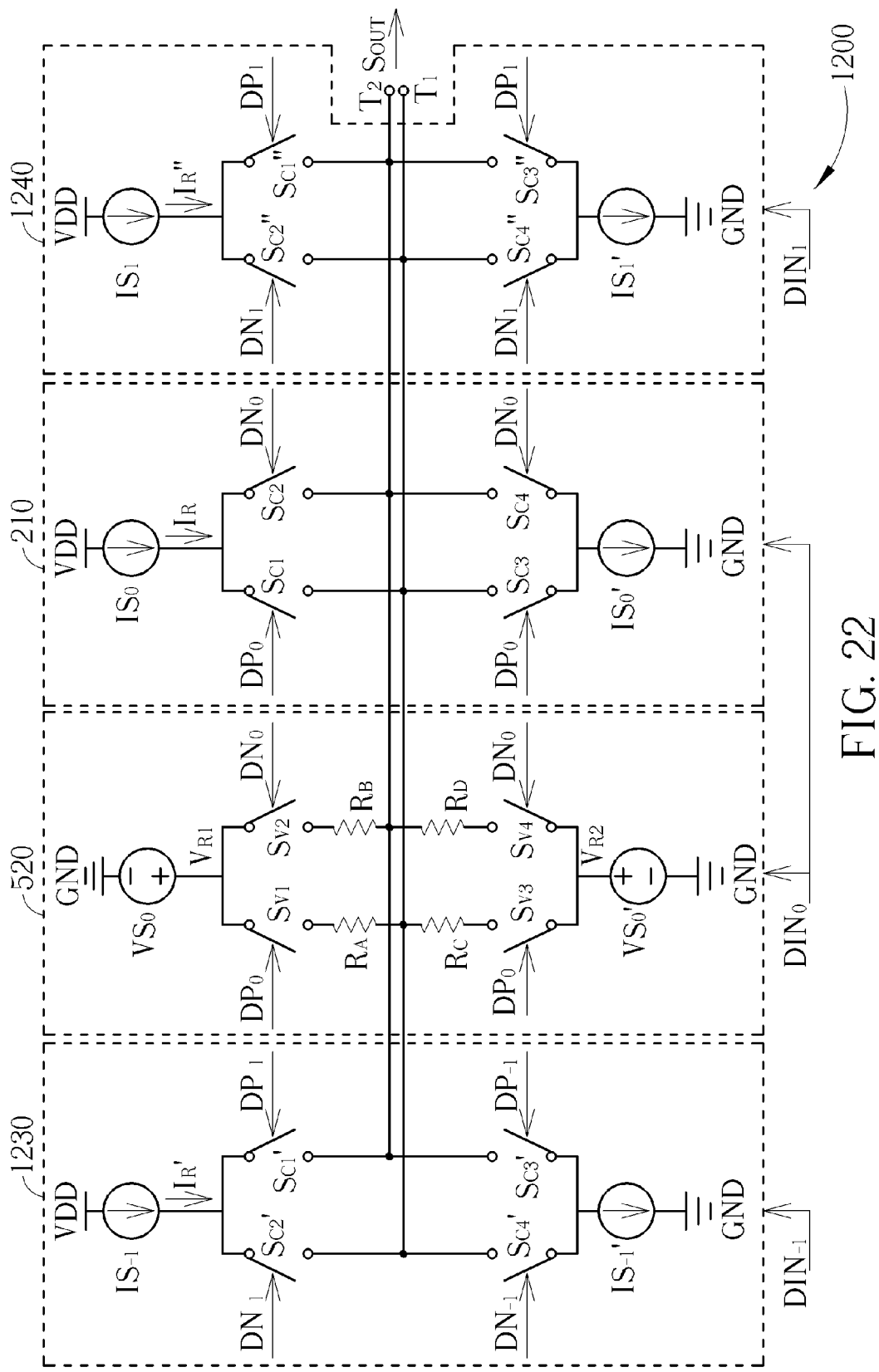
FIG. 22 is a diagram illustrating an exemplary driver circuit according to an embodiment of the present invention.

FIG. 22 is a diagram illustrating an exemplary driver circuit according to an embodiment of the present invention. The architecture of the driver circuit 1200 is based on that of the driver circuit 500 shown in FIG. 5, wherein the main difference is that the driver circuit 1200 may further include a current mode drive unit 1230 and a current mode drive unit 1240 for pre-emphasis and/or de-emphasis. Specifically, the driver circuit 1200 may receive a plurality of data inputs $DIN_0$, $DIN_{-1}$ and $DIN_1$, and accordingly generate the output signal $S_{OUT}$, wherein the data input $DIN_{-1}$ is an advanced data input relative to the data input $DIN_0$, and the data input $DIN_1$ is a delayed data input relative to the data input $DIN_0$. The current mode drive unit 1230 is coupled to the output terminal $T_1$ and the output terminal $T_2$ (a pair of differential output terminals), and is arranged for generating a reference current $I_R'$, outputting the reference current $I_R'$ from one of the output terminal $T_1$ and the output terminal $T_2$ according to the data input $DIN_{-1}$, and receiving the reference current $I_R'$ from the other of the output terminal $T_1$ and the output terminal $T_2$ according to the data input $DIN_{-1}$. The current mode drive unit 1240 is coupled to the output terminal $T_1$ and the output terminal $T_2$, and is arranged for generating a reference current $I_R''$, outputting the reference current $I_R''$ from one of the output terminal $T_1$ and the output terminal $T_2$ according to the data input $DIN_1$, and receiving the reference current $I_R''$ from the other of the output terminal $T_1$ and the output terminal $T_2$ according to the data input $DIN_1$.

In this embodiment, the architecture of the current mode drive unit 1230 is based on that of the current mode drive unit 210, and the architecture of the current mode drive unit 1240 is based on that of the current mode drive unit 210. Hence, the current mode drive unit 1230 may include a current source $IS_{-1}$, a current sink $IS_{-1}'$ and a plurality of switches $S_{C1}'$-$S_{C4}'$, and the current mode drive unit 1240 may include a current source $IS_1$, a current sink $IS_1'$ and a plurality of switches $S_{C1}''$-$S_{C4}''$. The data input $DIN_{-1}$ may include a data signal $DP_{-1}$ and a data signal $DN_{-1}$, wherein the data signal $DP_{-1}$ and the data signal $DN_{-1}$ may be inverted with respect to each other, or non-overlapping signals. The data signal $DP_{-1}$ may control switch states of the switches $S_{C1}'$ and $S_{C3}'$, and the data signal $DN_{-1}$ may control switch states of the switches $S_{C2}'$ and $S_{C4}'$, wherein the data signal $DP_{-1}$ is an advanced signal relative to the data signal $DP_0$ (e.g. advanced by one bit period), and the data signal $DN_{-1}$ is an advanced signal relative to the data signal $DN_0$ (e.g. advanced by one bit period). Similarly, the data input $DIN_1$ may include a data signal $DP_1$ and a data signal $DN_1$, wherein the data signal $DP_1$ and the data signal $DN_1$ may be inverted with respect to each other, or non-overlapping signals. The data signal $DP_1$ may control switch states of the switches $S_{C1}''$ and $S_{C3}''$, and the data signal $DN_1$ may control switch states of the switches $S_{C2}''$ and $S_{C4}''$, wherein the data signal $DP_1$ is an delayed signal relative to the data signal $DP_0$ (e.g. delayed by one bit period), and the data signal $DN_1$ is a delayed signal relative to the data signal $DN_0$ (e.g. delayed by one bit period).

As the purpose of pre-emphasis/de-emphasis is to apply advance/delay and inversion to a signal and add the signal back to an original signal with a proper weight, the switches $S_{C2}'$ and $S_{C4}'$ coupled to the output terminal $T_1$ may be controlled by the data signal $DN_{-1}$ (the advanced signal relative to the data signal $DN_0$), the switches $S_{C2}''$ and $S_{C4}''$ coupled to the output terminal $T_1$ may be controlled by the data signal $DN_1$ (the delayed signal relative to the data signal $DN_0$), the switches $S_{C1}'$ and $S_{C3}'$ coupled to the output terminal $T_2$ may be controlled by the data signal $DP_{-1}$ (the advanced signal relative to the data signal $DP_0$), and the switches $S_{C1}''$ and $S_{C3}''$ coupled to the output terminal $T_2$ may be controlled by the data signal $DP_1$ (the delayed signal relative to the data signal $DP_0$). Additionally, respective magnitudes of the reference currents $I_R'$ and $I_R''$ may be adjusted according to design considerations. As a person skilled in the field of transmitter equalizers should understand the operations of the driver circuit 1200 employed in a three-tap FIR equalizer after reading above paragraphs directed to FIGS. 1-7, further description is omitted here for brevity.

As shown in FIG. 22, channel loss compensation may be achieved by merely adding the current mode drive units 1230 and 1240 without modifying original circuit elements (e.g. the current mode drive unit 210 and/or the voltage mode drive unit 520), which means that the proposed driver architecture may have high design flexibility. Specifically, an N-tap FIR equalizer may be easily implemented using the proposed driver architecture, wherein N is a positive integer. For example, the current mode drive unit 1230 or the current mode drive unit 1240 may be optional. In another example, other current mode drive unit (s) may be added to implement an equalizer. Further, the current mode drive unit 210/1230/1240 may be replaced by a current mode drive unit which is implemented based on the operations of the current mode drive unit 110 shown in FIG. 1, and/or the voltage mode drive unit 520 may be replaced by a voltage mode drive unit which is implemented based on the operations of the voltage mode drive unit 120 shown in FIG. 1. For example, the driver circuit 200 shown in FIG. 2 may be used to implement the N-tap FIR equalizer.

To sum up, the proposed driver circuit may not only reduce power loss but also have high design flexibility. Additionally, as the proposed driver circuit may decrease a drive current, a size of a switch device may be reduced, thus decreasing a load impedance seen by a differential output pair and reducing parasitic capacitance. Moreover, the proposed driver circuit may increase an output swing while maintaining a low supply voltage level.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A driver circuit for receiving a first data input and generating an output signal to a termination element according to at least the first data input, the driver circuit comprising:
    a first output terminal, arranged for outputting the output signal;
    a first current mode drive unit, coupled to the first output terminal, the first current mode drive unit arranged for generating a first reference current, selectively outputting the first reference current from the first output terminal to the termination element according to the first data input, and selectively receiving the first reference current through the first output terminal according to the first data input, wherein the first output terminal is coupled between the first current mode drive unit and the termination element; when the first current mode drive unit outputs the first reference current, the first current mode drive unit steers the first reference current outputted from the first output terminal to flow into the termination element such that the first reference current outputted from the first current mode drive unit flows through the termination element and is used as at least a portion of a current flowing through the termination element; and
    a first voltage mode drive unit, coupled to the first output terminal, the first voltage mode drive unit arranged for coupling one of a first reference voltage and a second reference voltage to the first output terminal according to the first data input, wherein the first output terminal is coupled between the first voltage mode drive unit and the termination element, and the first reference voltage is different from the second reference voltage,
    wherein the first reference voltage is greater than the second reference voltage; when the first voltage mode drive unit couples the first reference voltage to the first output terminal according to the first data input, the first current mode drive unit outputs the first reference current from the first output terminal according to the first data input and when the first voltage mode drive unit couples the second reference voltage to the first output terminal according to the first data input, the first current mode drive unit receives the first reference current through the first output terminal according to the first data input.

2. The driver circuit of claim 1, wherein the current mode drive unit comprises:
    a current source, arranged for generating the first reference current, wherein the current source is selectively coupled to the first output terminal according to the first data input; and
    a current sink, arranged for receiving the first reference current, wherein the current sink is selectively coupled to the first output terminal according to the first data input;
    wherein when one of the current source and the current sink is coupled to the first output terminal according to the first data input, the other of the current source and the current sink is not coupled to the first output terminal.

3. The driver circuit of claim 2, wherein the current mode drive unit further comprises:
    a first switch, selectively coupled between the current source and the first output terminal according to the first data input; and
    a second switch, selectively coupled between the current sink and the first output terminal according to the first data input;
    wherein when the first switch is switched on due to the first data input, the second switch is switched off; and when the first switch is switched off due to the first data input, the second switch is switched on.

4. The driver circuit of claim 1, wherein the first voltage mode drive unit comprises:
    a first switch, selectively coupled between the first reference voltage and the first output terminal according to the first data input; and
    a second switch, selectively coupled between the second reference voltage and the first output terminal according to the first data input;
    wherein when the first switch is switched on due to the first data input, the second switch is switched off; and when the first switch is switched off due to the first data input, the second switch is switched on.

5. The driver circuit of claim 1, wherein the first voltage mode drive unit comprises:
    an impedance element, wherein one terminal of the impedance element is coupled to the first output terminal, and another terminal of the impedance element is coupled to the first reference voltage or coupled to the second reference voltage according to the first data input.

6. The driver circuit of claim 1, wherein the first voltage mode drive unit comprises:
    a first impedance element, selectively coupled between the first reference voltage and the first output terminal according to the first data input; and
    a second impedance element, selectively coupled between the second reference voltage and the first output terminal according to the first data input;
    wherein when the first reference voltage is coupled to the first output terminal through the first impedance element according to the first data input, the second reference voltage is not coupled to the first output terminal; and when the second reference voltage is coupled to the first output terminal through the second impedance element according to the first data input, the first reference voltage is not coupled to the first output terminal.

7. The driver circuit of claim 1, wherein the driver circuit is further arranged for receiving n−1 second data inputs, the driver circuit generates the output signal according to the first data input and the n−1 second data inputs, n is an integer greater than one, and the driver circuit further comprises:

n−1 second voltage mode drive units, coupled to the first output terminal and controlled by the n−1 second data inputs respectively, wherein each second voltage mode drive unit couples one of the first reference voltage and the second reference voltage to the first output terminal according to a second data input corresponding to the second voltage mode drive unit.

8. The driver circuit of claim 7, wherein the output signal comprises n components generated in response to the first data input and the n−1 second data inputs respectively; the first data input and the n−1 second data inputs correspond to a binary code of n bits; and the n components of the output signal have a binary-weighted relationship.

9. The driver circuit of claim 7, wherein at least one of the n−1 second data input is an advanced signal or a delayed signal relative to the first data input.

10. The driver circuit of claim 1, wherein the driver circuit is further arranged for receiving n−1 second data inputs, the driver circuit generates the output signal according to the first data input and the n−1 second data inputs, n is an integer greater than one, and the driver circuit further comprises:
n−1 second current mode drive units, coupled to the first output terminal and controlled by the n−1 second data inputs respectively, the n−1 second current mode drive units arranged for generating n−1 second reference currents respectively, wherein each second current mode drive unit selectively outputs a second reference current corresponding to the second current mode drive unit from the first output terminal to the termination element according to a second data input corresponding to the second current mode drive unit, and selectively receives the second reference current through the first output terminal according to the second data input.

11. The driver circuit of claim 10, wherein the output signal comprises n components generated in response to the first data input and the n−1 second data inputs respectively; the first data input and the n−1 second data inputs correspond to a binary code of n bits; and the n components of the output signal have a binary-weighted relationship.

12. The driver circuit of claim 10, wherein at least one of the n−1 second data input is an advanced signal or a delayed signal relative to the first data input.

13. The driver circuit of claim 1, further comprising:
a second output terminal, coupled to the first current mode drive unit and the first voltage mode drive unit, wherein the first output terminal and the second output terminal are used as a pair of differential output terminals, and arranged for outputting the output signal;
wherein the first current mode drive unit outputs the first reference current from one of the first output terminal and the second output terminal to the termination element according to the first data input, and receives the first reference current from the other of the first output terminal and the second output terminal according to the first data input; and the first voltage mode drive unit couples the first reference voltage to one of the first output terminal and the second output terminal according to the first data input, and couples the second reference voltage to the other of the first output terminal and the second output terminal according to the first data input.

14. The driver circuit of claim 13, wherein the first reference voltage is greater than the second reference voltage; and when the first current mode drive unit outputs the first reference current from the first output terminal and receives the first reference current from the second output terminal according to the first data input, the first voltage mode drive unit couples the first reference voltage to the first output terminal and couples the second reference voltage to the second output terminal according to the first data input.

15. The driver circuit of claim 13, wherein the first current mode drive unit comprises:
a current source, arranged for generating the first reference current; and
a current sink, arranged for receiving the first reference current, wherein the current source is coupled to one of the first output terminal and the second output terminal according to the first data input, and the current sink is coupled to the other of the first output terminal and the second output terminal according to the first data input.

16. The driver circuit of claim 15, wherein the first current mode drive unit further comprises:
a first switch, selectively coupled between the current source and the first output terminal according to the first data input;
a second switch, selectively coupled between the current source and the second output terminal according to the first data input;
a third switch, selectively coupled between the current sink and the first output terminal according to the first data input; and
a fourth switch, selectively coupled between the current sink and the second output terminal according to the first data input;
wherein when the first switch and the fourth switch are switched on due to the first data input, the second switch and the third switch are switched off; and when the first switch and the fourth switch are switched off due to the first data input, the second switch and the third switch are switched on.

17. The driver circuit of claim 13, wherein the first voltage mode drive unit comprises:
a first switch, selectively coupled between the first reference voltage and the first output terminal according to the first data input;
a second switch, selectively coupled between the first reference voltage and the second output terminal according to the first data input;
a third switch, selectively coupled between the second reference voltage and the first output terminal according to the first data input; and
a fourth switch, selectively coupled between the second reference voltage and the second output terminal according to the first data input;
wherein when the first switch and the fourth switch are switched on due to the first data input, the second switch and the third switch are switched off; and when the first switch and the fourth switch are switched off due to the first data input, the second switch and the third switch are switched on.

18. The driver circuit of claim 13, wherein the first voltage mode drive unit comprises:
a first impedance element, wherein one terminal of the first impedance element is coupled to the first output terminal; and
a second impedance element, wherein one terminal of the second impedance element is coupled to the second output terminal;
wherein another terminal of the first impedance element is coupled to one of the first reference voltage and the second reference voltage according to the first data input, and another terminal of the second impedance element is coupled to the other of the first reference voltage and the second reference voltage according to the first data input.

19. The driver circuit of claim 13, wherein the first voltage mode drive unit comprises:
   a first impedance element, wherein one terminal of the first impedance element is coupled to the first output terminal;
   a second impedance element, wherein one terminal of the second impedance element is coupled to the second output terminal, and the first reference voltage is coupled to one of another terminal of the first impedance element and another terminal of the second impedance element according to the first data input;
   a third impedance element, wherein one terminal of the third impedance element is coupled to the first output terminal;
   a fourth impedance element, wherein one terminal of the fourth impedance element is coupled to the second output terminal, and the second reference voltage is coupled to one of another terminal of the third impedance element and another terminal of the fourth impedance element according to the first data input;
   wherein when the first reference voltage is coupled to the another terminal of the first impedance element according to the first data input, the second reference voltage is coupled to the another terminal of the fourth impedance element; and when the first reference voltage is coupled to the another terminal of the second impedance element according to the first data input, the second reference voltage is coupled to the another terminal of the third impedance element.

20. The driver circuit of claim 13, wherein the driver circuit is further arranged for receiving n−1 second data inputs, the driver circuit generates the output signal according to the first data input and the n−1 second data inputs, n is an integer greater than one, and the driver circuit further comprises:
   n−1 second voltage mode drive units, coupled to the first output terminal and the second output terminal and controlled by the n−1 second data inputs respectively, wherein each second voltage mode drive unit couples the first reference voltage to one of the first output terminal and the second output terminal according to a second data input corresponding to the second voltage mode drive unit, and couples the second reference voltage to the other of the first output terminal and the second output terminal according to the second data input.

21. The driver circuit of claim 20, wherein the output signal comprises n components generated in response to the first data input and the n−1 second data inputs respectively; the first data input and the n−1 second data inputs correspond to a binary code of n bits; and the n components of the output signal have a binary-weighted relationship.

22. The driver circuit of claim 20, wherein at least one of the n−1 second data input is an advanced signal or a delayed signal relative to the first data input.

23. The driver circuit of claim 13, wherein the driver circuit is further arranged for receiving n−1 second data inputs, the driver circuit generates the output signal according to the first data input and the n−1 second data inputs, n is an integer greater than one, and the driver circuit further comprises:
   n−1 second current mode drive units, coupled to the first output terminal and the second output terminal and controlled by the n−1 second data inputs respectively, the n−1 second current mode drive units arranged for generating n−1 second reference currents respectively, wherein each second current mode drive unit outputs the first reference current from one of the first output terminal and the second output terminal to the termination element according to a second reference current corresponding to the second current mode drive unit, and receives the first reference current from the other of the first output terminal and the second output terminal according to the second data input.

24. The driver circuit of claim 23, wherein the output signal comprises n components generated in response to the first data input and the n−1 second data inputs respectively; the first data input and the n−1 second data inputs correspond to a binary code of n bits; and the n components of the output signal have a binary-weighted relationship.

25. The driver circuit of claim 23, wherein at least one of the n−1 second data input is an advanced signal or a delayed signal relative to the first data input.

26. A driver circuit for receiving a first data input and generating an output signal to a termination element according to at least the first data input, the driver circuit comprising:
   a first output terminal, arranged for outputting the output signal;
   a first current mode drive unit, coupled to the first output terminal, the first current mode drive unit arranged for generating a first reference current, selectively outputting the first reference current from the first output terminal to the termination element according to the first data input, and selectively receiving the first reference current through the first output terminal according to the first data input, wherein when the first current mode drive unit outputs the first reference current, the first current mode drive unit steers the first reference current to flow into the termination element such that the first reference current outputted from the first current mode drive unit flows through the termination element and is used as at least a portion of a current flowing through the termination element; and
   a first voltage mode drive unit, coupled to the first output terminal, the first voltage mode drive unit arranged for coupling one of a first reference voltage and a second reference voltage to the first output terminal according to the first data input, wherein the first reference voltage is different from the second reference voltage;
   wherein the driver circuit is further arranged for receiving n−1 second data inputs, the driver circuit generates the output signal according to the first data input and the n−1 second data inputs, n is an integer greater than one, and the driver circuit further comprises:
   n−1 second voltage mode drive units, coupled to the first output terminal and controlled by the n−1 second data inputs respectively, wherein each second voltage mode drive unit couples one of the first reference voltage and the second reference voltage to the first output terminal according to a second data input corresponding to the second voltage mode drive unit.

27. A driver circuit for receiving a first data input and generating an output signal to a termination element according to at least the first data input, the driver circuit comprising:
   a first output terminal, arranged for outputting the output signal;
   a first current mode drive unit, coupled to the first output terminal, the first current mode drive unit arranged for generating a first reference current, selectively outputting the first reference current from the first output terminal to the termination element according to the first data input, and selectively receiving the first reference current through the first output terminal according to the first data input, wherein when the first current mode drive unit outputs the first reference current, the first current mode drive unit steers the first reference current to flow into the termination element such that the first reference current outputted from the first current mode drive unit flows through the termination element and is used as at least a portion of a current flowing through the termination element; and a first voltage mode drive unit, coupled to the first output terminal, the first voltage mode drive unit arranged for coupling one of a first reference voltage and a second reference voltage to the first output terminal according to the first data input, wherein the first reference voltage is different from the second reference voltage;

wherein the driver circuit is further arranged for receiving n−1 second data inputs, the driver circuit generates the output signal according to the first data input and the n−1 second data inputs, n is an integer greater than one, and the driver circuit further comprises:

n−1 second current mode drive units, coupled to the first output terminal and controlled by the n−1 second data inputs respectively, the n−1 second current mode drive units arranged for generating n−1 second reference currents respectively, wherein each second current mode drive unit selectively outputs a second reference current corresponding to the second current mode drive unit from the first output terminal to the termination element according to a second data input corresponding to the second current mode drive unit, and selectively receives the second reference current through the first output terminal according to the second data input.

28. A driver circuit for receiving a first data input and generating an output signal to a termination element according to at least the first data input, the driver circuit comprising:

a first output terminal, arranged for outputting the output signal;

a first current mode drive unit, coupled to the first output terminal, the first current mode drive unit arranged for generating a first reference current, selectively outputting the first reference current from the first output terminal to the termination element according to the first data input, and selectively receiving the first reference current through the first output terminal according to the first data input, wherein when the first current mode drive unit outputs the first reference current, the first current mode drive unit steers the first reference current to flow into the termination element such that the first reference current outputted from the first current mode drive unit flows through the termination element and is used as at least a portion of a current flowing through the termination element;

a first voltage mode drive unit, coupled to the first output terminal, the first voltage mode drive unit arranged for coupling one of a first reference voltage and a second reference voltage to the first output terminal according to the first data input, wherein the first reference voltage is different from the second reference voltage; and a second output terminal, coupled to the first current mode drive unit and the first voltage mode drive unit, wherein the first output terminal and the second output terminal are used as a pair of differential output terminals, and arranged for outputting the output signal;

wherein the first current mode drive unit outputs the first reference current from one of the first output terminal and the second output terminal to the termination element according to the first data input, and receives the first reference current from the other of the first output terminal and the second output terminal according to the first data input; and the first voltage mode drive unit couples the first reference voltage to one of the first output terminal and the second output terminal according to the first data input, and couples the second reference voltage to the other of the first output terminal and the second output terminal according to the first data input;

wherein the driver circuit is further arranged for receiving n−1 second data inputs, the driver circuit generates the output signal according to the first data input and the n−1 second data inputs, n is an integer greater than one, and the driver circuit further comprises:

n−1 second voltage mode drive units, coupled to the first output terminal and the second output terminal and controlled by the n−1 second data inputs respectively, wherein each second voltage mode drive unit couples the first reference voltage to one of the first output terminal and the second output terminal according to a second data input corresponding to the second voltage mode drive unit, and couples the second reference voltage to the other of the first output terminal and the second output terminal according to the second data input.

29. A driver circuit for receiving a first data input and generating an output signal to a termination element according to at least the first data input, the driver circuit comprising:

a first output terminal, arranged for outputting the output signal;

a first current mode drive unit, coupled to the first output terminal, the first current mode drive unit arranged for generating a first reference current, selectively outputting the first reference current from the first output terminal to the termination element according to the first data input, and selectively receiving the first reference current through the first output terminal according to the first data input, wherein when the first current mode drive unit outputs the first reference current, the first current mode drive unit steers the first reference current to flow into the termination element such that the first reference current outputted from the first current mode drive unit flows through the termination element and is used as at least a portion of a current flowing through the termination element;

a first voltage mode drive unit, coupled to the first output terminal, the first voltage mode drive unit arranged for coupling one of a first reference voltage and a second reference voltage to the first output terminal according to the first data input, wherein the first reference voltage is different from the second reference voltage; and a second output terminal, coupled to the first current mode drive unit and the first voltage mode drive unit, wherein the first output terminal and the second output terminal are used as a pair of differential output terminals, and arranged for outputting the output signal;

wherein the first current mode drive unit outputs the first reference current from one of the first output terminal and the second output terminal to the termination element according to the first data input, and receives the first reference current from the other of the first output terminal and the second output terminal according to the first data input; and the first voltage mode drive unit couples the first reference voltage to one of the first output terminal and the second output terminal according to the first data input, and couples the second reference voltage to the other of the first output terminal and the second output terminal according to the first data input;

wherein the driver circuit is further arranged for receiving n−1 second data inputs, the driver circuit generates the output signal according to the first data input and the n−1 second data inputs, n is an integer greater than one, and the driver circuit further comprises:

n−1 second current mode drive units, coupled to the first output terminal and the second output terminal and controlled by the n−1 second data inputs respectively, the n−1 second current mode drive units arranged for generating n−1 second reference currents respectively, wherein each second current mode drive unit outputs the first reference current from one of the first output terminal and the second output terminal to the termination element according to a second reference current corresponding to the second current mode drive unit, and receives the first reference current from the other of the first output terminal and the second output terminal according to the second data input.

* * * * *